US009825006B2

(12) United States Patent
Miki

(10) Patent No.: US 9,825,006 B2
(45) Date of Patent: *Nov. 21, 2017

(54) ELECTRONIC COMPONENT DEVICE AND MANUFACTURING METHOD THEREOF

(71) Applicant: SHINKO ELECTRIC INDUSTRIES CO., LTD., Nagano-shi, Nagano (JP)

(72) Inventor: Shota Miki, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/206,422

(22) Filed: Jul. 11, 2016

(65) Prior Publication Data

US 2017/0018534 A1    Jan. 19, 2017

(30) Foreign Application Priority Data

Jul. 14, 2015  (JP) ................. 2015-140304

(51) Int. Cl.
*H01L 25/065* (2006.01)
*H01L 23/544* (2006.01)
*H01L 25/00* (2006.01)
*H01L 21/56* (2006.01)

(52) U.S. Cl.
CPC ........ *H01L 25/0657* (2013.01); *H01L 21/563* (2013.01); *H01L 23/544* (2013.01); *H01L 25/50* (2013.01); *H01L 2223/5442* (2013.01); *H01L 2223/54426* (2013.01); *H01L 2223/54473* (2013.01); *H01L 2223/54486* (2013.01); *H01L 2224/16145* (2013.01); *H01L 2224/73204* (2013.01); *H01L 2225/06513* (2013.01); *H01L 2225/06517* (2013.01);
(Continued)

(58) Field of Classification Search
CPC . H01L 25/0657; H01L 25/50; H01L 23/3142; H01L 23/3121; H01L 23/18; H01L 21/563; H01L 23/544; H01L 25/0652; H01L 24/97; H01L 24/81; H01L 23/3114
See application file for complete search history.

(56) References Cited

U.S. PATENT DOCUMENTS

2011/0089438 A1* 4/2011 Steijer ............... H01L 24/81
257/82
2012/0306075 A1* 12/2012 Kim .................. H01L 25/105
257/738
2013/0037943 A1   2/2013 Yamano
(Continued)

FOREIGN PATENT DOCUMENTS

JP         2013-55313       3/2013

*Primary Examiner* — Bitew Dinke
(74) *Attorney, Agent, or Firm* — Rankin, Hill & Clark LLP

(57) ABSTRACT

An electronic component device includes a first electronic component, a second electronic component disposed on and connected to the first electronic component, a first underfill resin filled between the first electronic component and the second electronic component, the first underfill resin having a base part arranged around the second electronic component and an alignment mark formed on an upper surface of the base part, a third electronic component disposed on and connected to the second electronic component, and a second underfill resin filled between the second electronic component and the third electronic component.

24 Claims, 25 Drawing Sheets

(52) U.S. Cl.
CPC ............. *H01L 2225/06541* (2013.01); *H01L 2225/06593* (2013.01); *H01L 2924/181* (2013.01); *H01L 2924/1815* (2013.01)

(56) References Cited

U.S. PATENT DOCUMENTS

| | | | | |
|---|---|---|---|---|
| 2013/0137216 | A1* | 5/2013 | Ito | H01L 25/0652 |
| | | | | 438/108 |
| 2013/0249085 | A1* | 9/2013 | Ide | H01L 23/49811 |
| | | | | 257/737 |
| 2014/0001652 | A1* | 1/2014 | Chen | H01L 23/00 |
| | | | | 257/777 |
| 2014/0252657 | A1* | 9/2014 | Liu | H01L 21/565 |
| | | | | 257/782 |
| 2015/0069596 | A1* | 3/2015 | Kawasaki | H01L 23/367 |
| | | | | 257/712 |
| 2015/0130083 | A1* | 5/2015 | Park | H01L 25/0657 |
| | | | | 257/777 |
| 2015/0228624 | A1* | 8/2015 | Miki | H01L 25/0657 |
| | | | | 257/778 |
| 2015/0380394 | A1* | 12/2015 | Jang | H01L 25/50 |
| | | | | 438/108 |
| 2016/0079184 | A1* | 3/2016 | Tsukiyama | H01L 24/16 |
| | | | | 257/737 |
| 2016/0141273 | A1* | 5/2016 | Tsuji | H01L 23/544 |
| | | | | 257/737 |
| 2016/0329304 | A1* | 11/2016 | Hatakeyama | H01L 24/97 |
| 2017/0018533 | A1* | 1/2017 | Miki | H01L 25/0657 |
| 2017/0040297 | A1* | 2/2017 | Kitada | H01L 25/0657 |

\* cited by examiner

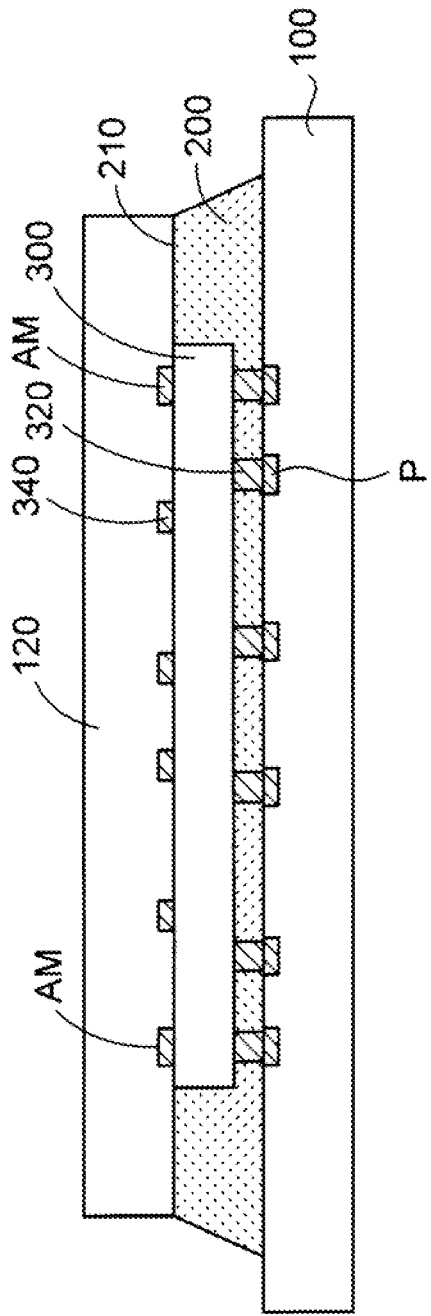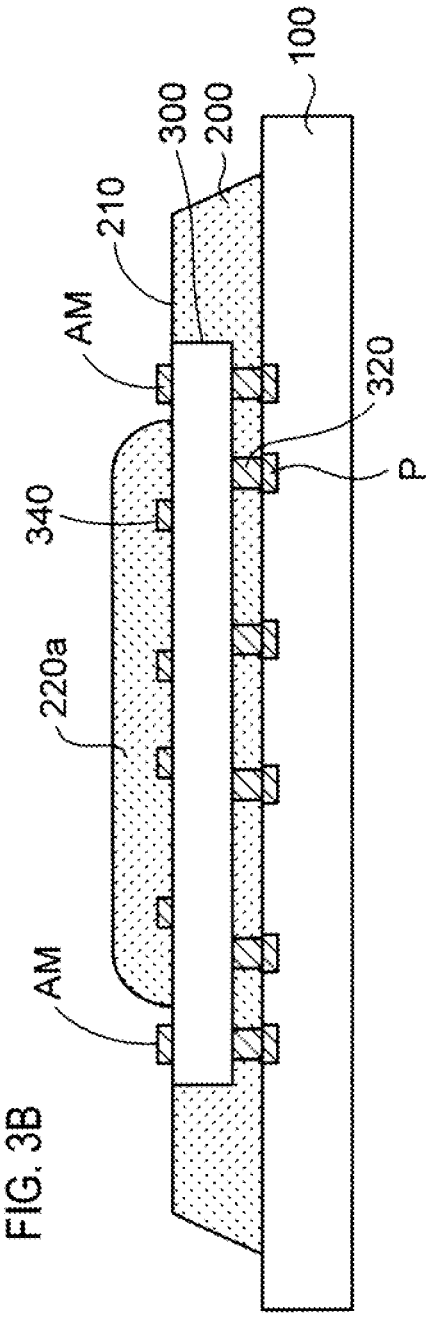

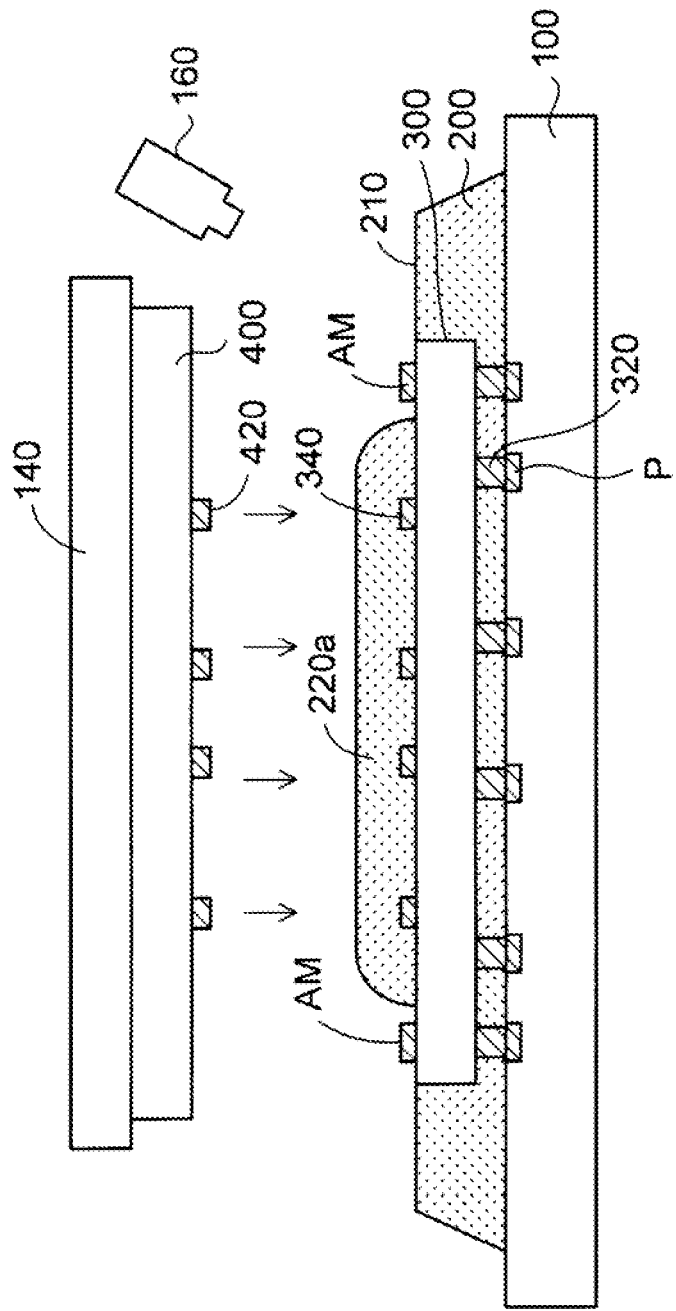

ELECTRONIC COMPONENT DEVICE AND MANUFACTURING METHOD THEREOF

CROSS-REFERENCE TO RELATED APPLICATION

The present application claims priority from Japanese Patent Application No. 2015-140304 filed on Jul. 14, 2015, the entire content of which is incorporated herein by reference.

BACKGROUND

Technical Field

The disclosure relates to an electronic component device and a manufacturing method thereof.

In the related art, an electronic component device where an electronic component such as a semiconductor chip is mounted on a wiring substrate has been known. Regarding the electronic component device, a technology of flip-chip connecting a first semiconductor chip on the wiring substrate and then flip-chip connecting a second semiconductor chip on the first semiconductor chip so as to intend additional high density of mounting has been developed.

[Patent Document 1] Japanese Patent Application Publication No. 2013-55313A

As described later in paragraphs of preliminary matters, a manufacturing method of a multi-layer electronic component device includes a process of flip-chip connecting a second semiconductor chip to a first semiconductor chip mounted on a wiring substrate.

At this time, a position of the second semiconductor chip is aligned relative to the first semiconductor chip by image recognizing an alignment mark formed at a peripheral edge portion of the first semiconductor chip. Since the alignment mark of the first semiconductor chip is formed at the peripheral edge portion, it is not possible to stably perform the position alignment by the image recognition.

SUMMARY

Exemplary embodiments of the invention provide an electronic component device and a manufacturing method thereof with a novel structure capable of stably aligning a position of an upper electronic component relative to a lower electronic component.

An electronic component device according to the exemplary embodiment comprises:

a first electronic component;

a second electronic component disposed on and connected to the first electronic component;

a first underfill resin filled between the first electronic component and the second electronic component, the first underfill resin having a base part arranged around the second electronic component and an alignment mark formed on an upper surface of the base part;

a third electronic component disposed on and connected to the second electronic component; and a second underfill resin filled between the second electronic component and the third electronic component.

A manufacturing method of an electronic component device, according to the exemplary embodiment, comprises:

forming a first sealing resin material on a first electronic component;

flip-chip connecting an electrode of a second electronic component to the first electronic component via the first sealing resin material so that a first underfill resin is filled between the first electronic component and the second electronic component while forming a base part having an alignment mark on an upper surface thereof around the second electronic component by the first underfill resin;

aligning a position of a third electronic component relative to the second electronic component, based on image recognition of the alignment mark; and flip-chip connecting an electrode of the third electronic component to the second electronic component via a second sealing resin material so that a second underfill resin is filled between the second electronic component and the third electronic component.

A manufacturing method of an electronic component device, according to the exemplary embodiment, comprises:

forming a sealing resin material on a first electronic component;

pushing an electrode of a second electronic component into the sealing resin material to flip-chip connect the electrode to the first electronic component so that a first underfill resin is filled between the electronic component and the second electronic component while forming a base part having an alignment mark on an upper surface thereof around the second electronic component by the first underfill resin;

aligning a position of a third electronic component relative to the second electronic component, based on image recognition of the alignment mark;

flip-chip connecting the third electronic component on the second electronic component in a state that the third electronic component is disposed on the second electronic component; and filling a second underfill resin between the second electronic component and the third electronic component.

According to the below disclosure, in the electronic component device, the second electronic component is connected on the first electronic component, and the first underfill resin is filled between the first electronic component and the second electronic component. The first underfill resin has the base part arranged around the second electronic component and the alignment mark formed on the upper surface of the base part.

Also, the third electronic component is connected on the second electronic component, and the second underfill resin is filled between the second electronic component and the third electronic component.

By using the alignment mark formed on the underfill resin in the region outside the second electronic component, it is possible to clearly image-recognize the alignment mark when aligning the position of the third electronic component relative to the second electronic component.

Thereby, since the position of the third electronic component can be stably aligned relative to the second electronic component, it is possible to manufacture the electronic component device in good yield.

The first to third electronic components may be a wiring substrate, a silicon interposer, or a semiconductor chip.

BRIEF DESCRIPTION OF THE DRAWINGS

FIGS. 3A and 3B are sectional views for illustrating the manufacturing method of the electronic component device relating to the preliminary matters (3 thereof).

FIG. 4 is a sectional view for illustrating the manufacturing method of the electronic component device relating to the preliminary matters (4 thereof).

DETAILED DESCRIPTION

Hereinafter, an exemplary embodiment will be described with reference to the accompanying drawings.

Before describing the exemplary embodiment, preliminary matters, which are bases of the disclosure, are first described. It should be noted that the preliminary matters include personal investigation contents of the inventors and are not a known technology.

Figure 1A:
FIGS. 1A and 1B are sectional views for illustrating a manufacturing method of an electronic component device relating to preliminary matters (1 thereof).
Figure 1B:
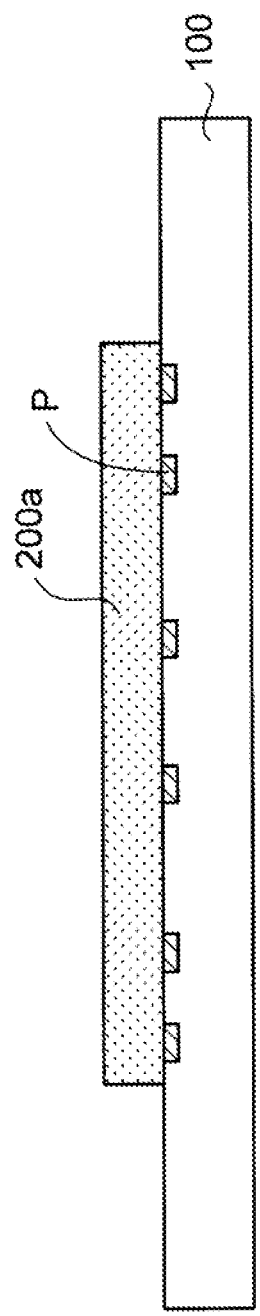

In a manufacturing method of a multi-layer electronic component device relating to the preliminary matters, as shown in FIG. 1A, a wiring substrate 100 having connection pads P on an upper surface is first prepared. Then, as shown in FIG. 1B, a first semi-cured sealing resin material 200a is formed on the wiring substrate 100. Also, as shown in FIG. 2, a first semiconductor chip 300 is prepared.

The first semiconductor chip 300 has bump electrodes 320 on an element formation surface-side and connection electrodes 340 on a backside. The bump electrodes 320 and the connection electrodes 340 of the first semiconductor chip 300 are connected to each other via through-electrodes (not shown). An area of the first sealing resin material 200a is set to be greater than an area of the first semiconductor chip 300. Also, alignment marks AM are formed at a peripheral edge portion of the backside of the first semiconductor chip 300.

Figure 2:
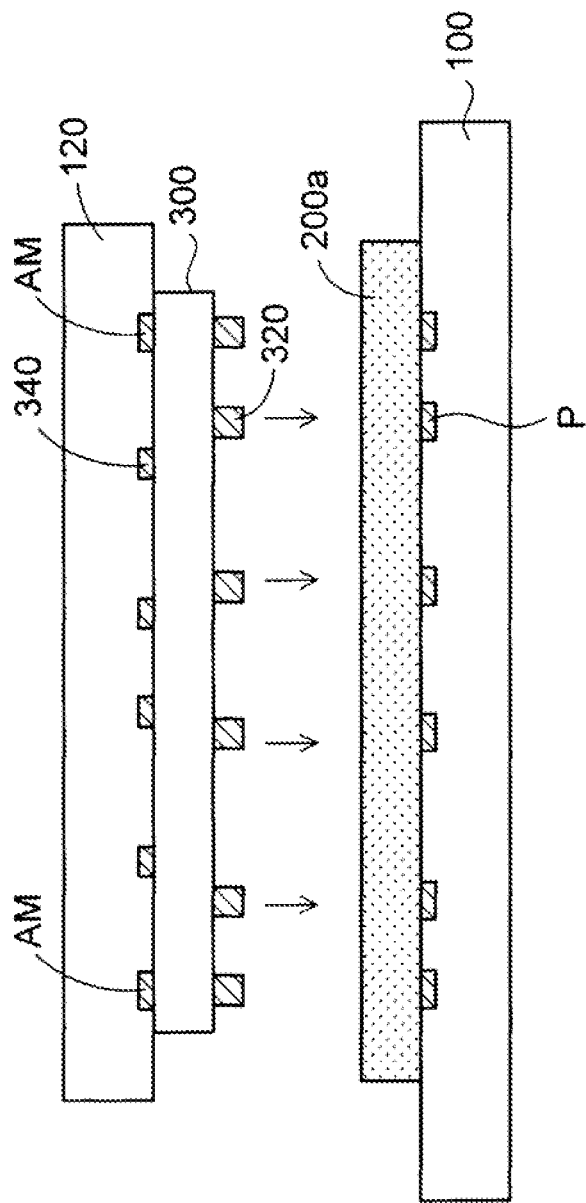
FIG. 2 is a sectional view for illustrating the manufacturing method of the electronic component device relating to the preliminary matters (2 thereof).

As shown in FIG. 2, the backside of the semiconductor chip 300 is sucked to a first bonding tool 120. Subsequently, referring to FIG. 3A, the bump electrodes 320 of the first semiconductor chip 300 sucked to the first bonding tool 120 are pushed into the first sealing resin material 200a and pressure-contacted to the connection pads P of the wiring substrate 100.

Also, solders (not shown) of tips of the bump electrodes 320 of the first semiconductor chip 300 are subjected to reflow by performing heating processing with the first bonding tool 120. Thereby, the bump electrodes 320 of the first semiconductor chip 300 are flip-chip connected to the connection pads P of the wiring substrate 100.

By the above processes, a first underfill resin 200 formed of the first sealing resin material 200a is filled between the first semiconductor chip 300 and the wiring substrate 100. The first underfill resin 200 is formed to have a base part 210 around the first semiconductor chip 300.

The base part 210 of the first underfill resin 200 is formed as the first sealing resin material 200a is pressed by the peripheral edge portion of the first bonding tool 120. Thereafter, the first bonding tool 120 is removed from the first semiconductor chip 300.

Then, as shown in FIG. 3B, a second liquid sealing resin material 220a is applied onto the backside of the first semiconductor chip 300. The second sealing resin material 220a is formed at a main central part of the backside of the first semiconductor chip 300, except for the alignment marks AM.

Subsequently, as shown in FIG. 4, a second semiconductor chip 400 having bump electrodes 420 on an element formation surface-side is prepared. An area of the second semiconductor chip 400 is set to be greater than the area of the first semiconductor chip 300.

Then, as shown in FIG. 4, a backside of the second semiconductor chip 400 is sucked to a second bonding tool 140, and the alignment marks AM of the first semiconductor chip 300 are image-recognized by an imaging camera 160. Based on the image recognition, a position of the second semiconductor chip 400 sucked to the second bonding tool 140 is aligned relative to the first semiconductor chip 300.

Figure 5:
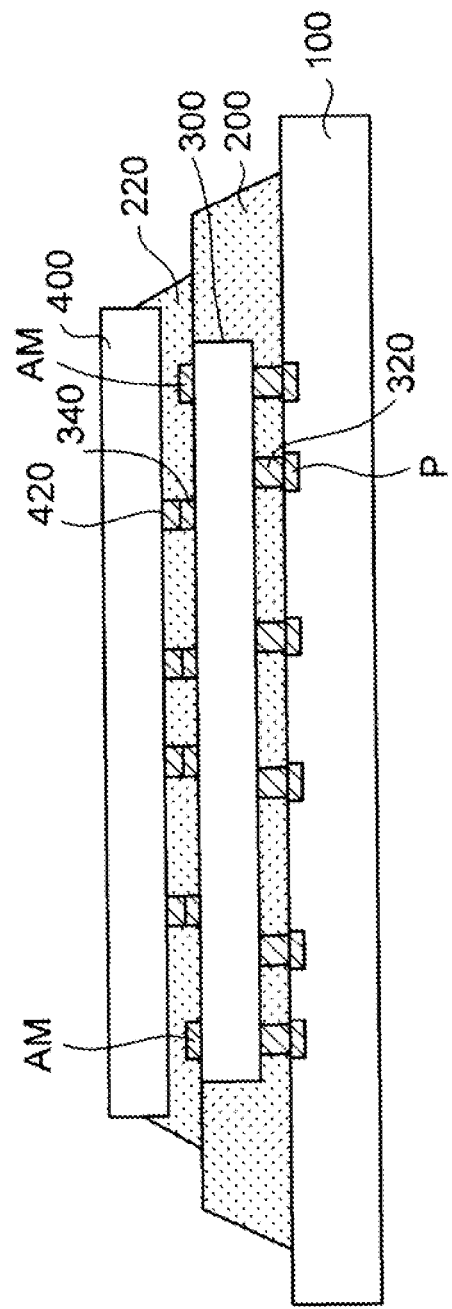
FIG. 5 is a sectional view for illustrating the manufacturing method of the electronic component device relating to the preliminary matters (5 thereof).

Also, as shown in FIG. 5, the bump electrodes 420 of the second semiconductor chip 400 sucked to the second bonding tool 140 are pushed into the second sealing resin material 220a and pressure-contacted to the connection electrodes 340 of the first semiconductor chip 300. In FIG. 5, the second bonding tool 140 is not shown.

Also, solders (not shown) of tips of the bump electrodes 420 of the second semiconductor chip 400 are subjected to reflow by performing heating processing with the second bonding tool 140. Thereby, the bump electrodes 420 of the second semiconductor chip 400 are flip-chip connected to the connection electrodes 340 of the first semiconductor chip 300.

By the above processes, as shown in FIG. 5, a second underfill resin 220 is filled between the first semiconductor chip 300 and the second semiconductor chip 400. The second underfill resin 220 is formed to extend from above the base part 210 of the first underfill resin 200 towards side surfaces of the second semiconductor chip 400.

In the process of forming the first underfill resin 200 shown in FIGS. 2 and 3A, the first underfill resin 200 may formed on the alignment marks AM arranged at the peripheral edge portion of the first semiconductor chip 300.

In this case, when a resin having low transparency is used as the first underfill resin 200, it is not possible to image-recognize the alignment marks AM by the imaging camera 160 in the process of FIG. 4.

Like this, according to the method of aligning the position of the second semiconductor chip 400 by using the alignment marks AM arranged at the peripheral edge portion of the first semiconductor chip 300, it is not possible to stably performing the position alignment.

An electronic component device and a manufacturing method of an exemplary embodiment, which will be described later, can solve the above problem on the position alignment.

EXEMPLARY EMBODIMENT

Figure 24:
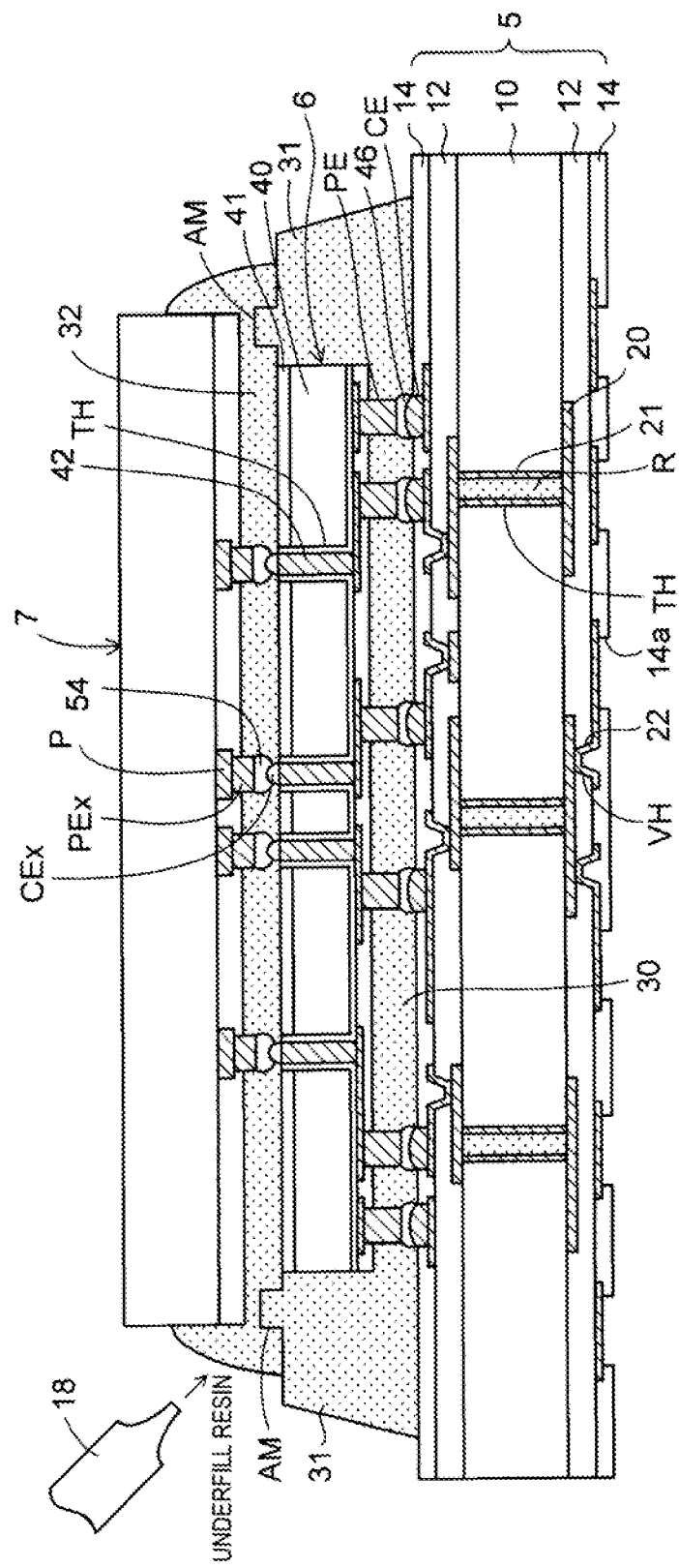
FIG. 24 is a sectional view depicting the manufacturing method of the electronic component device according to the exemplary embodiment (18 thereof), more specifically, depicting the other method of forming a second underfill resin.
Figure 25:
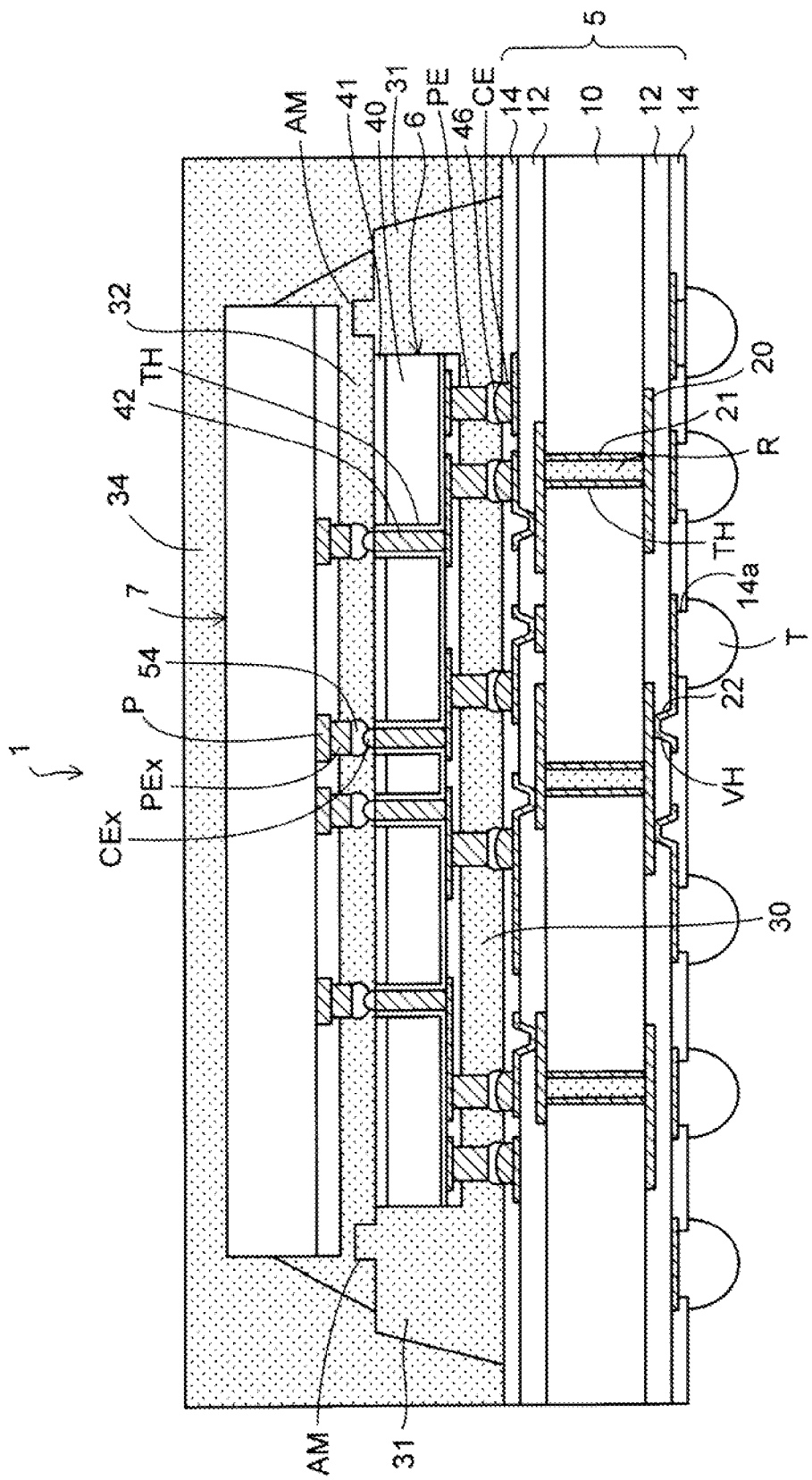
FIG. 25 is a sectional view depicting an electronic component device according to the exemplary embodiment.

FIGS. 6 to 24 illustrate a manufacturing method of an electronic component device of an exemplary embodiment, and FIG. 25 depicts an electronic component device of the exemplary embodiment. In the below, a structure of the electronic component device is described while explaining the manufacturing method of the electronic component device.

Figure 6:
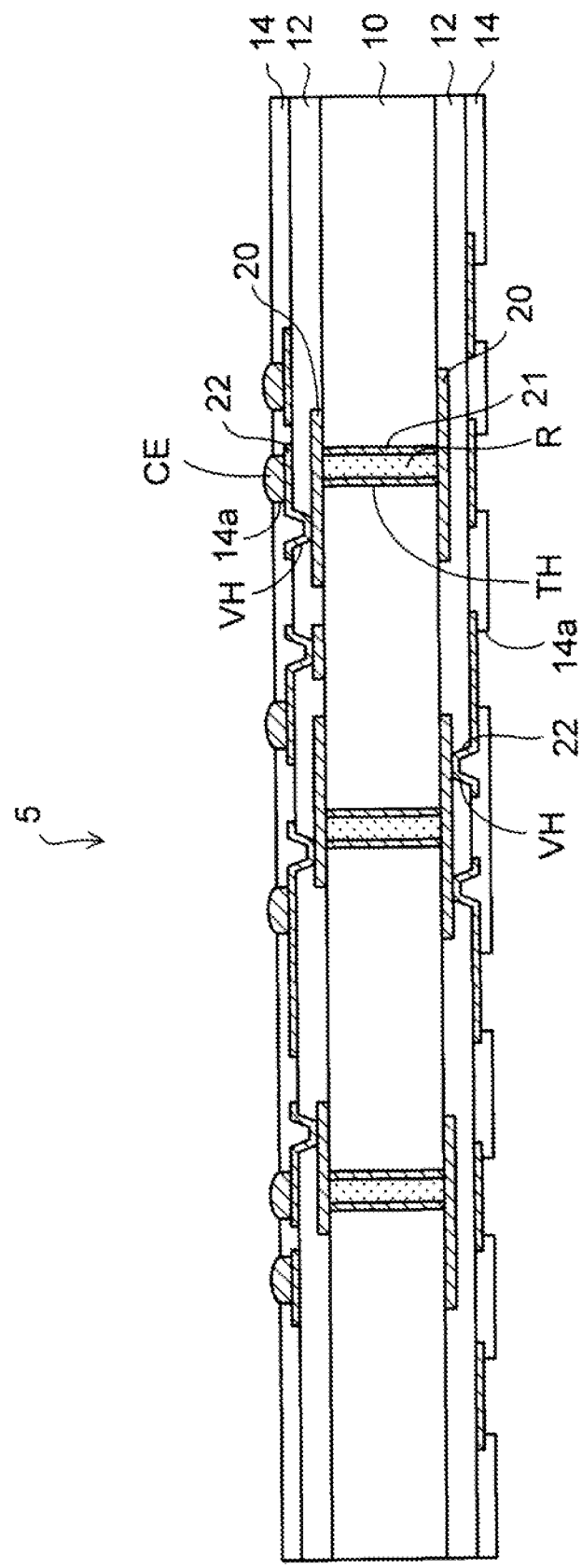
FIG. 6 is a sectional view depicting a manufacturing method of an electronic component device according to an exemplary embodiment (1 thereof).

In the manufacturing method of the electronic component device of the exemplary embodiment, a wiring substrate 5 as shown in FIG. 6 is first prepared. The wiring substrate 5 has a core substrate 10 at a central part in a thickness direction. The core substrate 10 is formed of an insulating material such as a glass epoxy resin or the like. The wiring substrate 5 is an example of the first electronic component.

Both surfaces of the core substrate 10 are formed with first wiring layers 20 made of copper or copper alloy, respectively. The core substrate 10 is formed with through-holes TH penetrating in the thickness direction. An inner wall of the through-hole TH is formed with a through-hole plating layer 21, and the other part of the through-hole TH is filled with a resin material R. Alternatively, a structure where the entire through-holes TH of the core substrate 10 are filled with through-electrodes by plating may also be adopted.

The first wiring layers 20 formed on both surfaces of the core substrate 10 are connected to each other via the through-hole plating layer 21. Both surfaces of the core substrate 10 are formed with insulating layers 12 having via-holes VH arranged on connection parts of the first wiring layers 20, respectively. The insulating layer 12 is formed of an insulating resin such as an epoxy resin, a polyimide resin or the like.

Also, second wiring layers 22 are formed on the insulating layers 12 of both surfaces. The second wiring layers 22 are connected to the first wiring layers 20 through via-holes VH, respectively. The second wiring layer 22 is formed of copper or copper alloy.

Also, solder resist layers 14 are formed on the insulating layers 12 of both surfaces. The solder resist layers 14 have openings 14a arranged on connection parts of the second wiring layers 22, respectively. The solder resist layer 14 is formed of an insulating resin such as a polyimide resin, an acryl resin or the like.

The connection part of the second wiring layer 22 formed on the upper surface-side of the core substrate 10 is formed with connection electrodes CE such as nickel/gold plating layer, solder or the like.

Then, the wiring substrate 5 is subjected to heating processing of about 125° C. for removing moistures. Also, the upper surface of the wiring substrate 5 is subjected to argon plasma processing for improving wettability. Thereby, preprocessing for forming a sealing resin material is completed.

Figure 7:
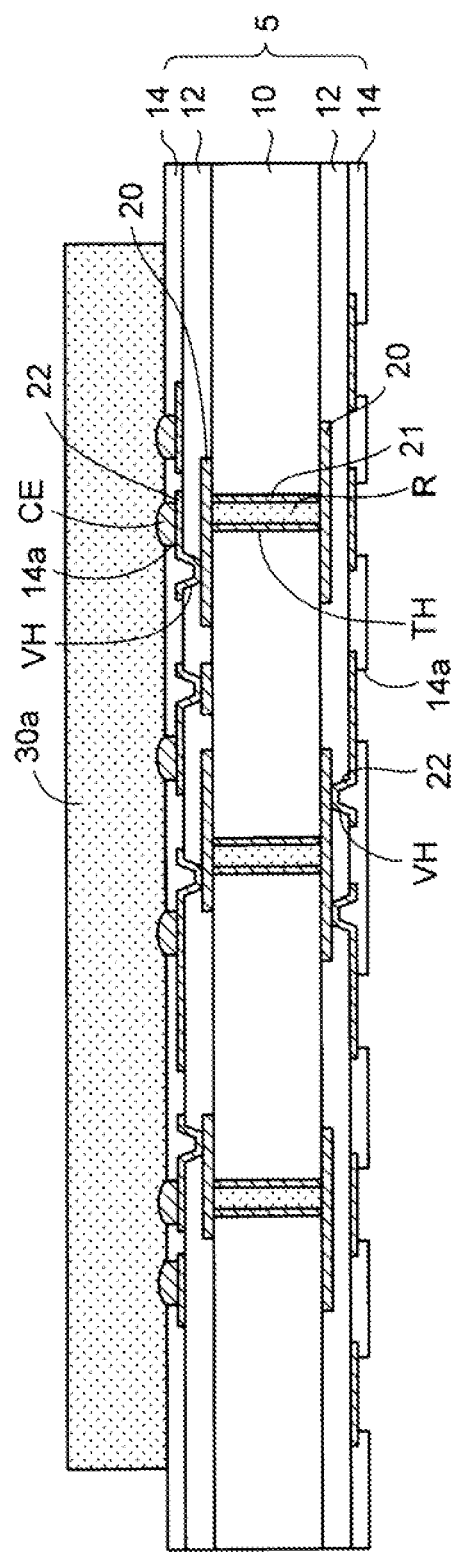
FIG. 7 is a sectional view depicting the manufacturing method of the electronic component device according to the exemplary embodiment (2 thereof).

Subsequently, as shown in FIG. 7, a first semi-cured sealing resin material 30a is formed on the wiring substrate 5. In the example of FIG. 7, the first sealing resin material 30a is formed of a resin sheet. At this time, an epoxy-based resin, an acryl-based resin or the like is used.

The wiring substrate 5 is a large-sized substrate having a plurality of component mounting regions defined therein. In FIG. 7, one component mounting region is partially shown. The first sealing resin material 30a may be arranged with being divided in each component mounting region of the wiring substrate 5 or the first sealing resin material 30a may be arranged over the entire surface of the wiring substrate 5.

When dividing and arranging the first sealing resin material 30a in each component mounting region of the wiring substrate 5, a masking tape (not shown) having an opening on each component mounting region is bonded on the wiring substrate 5.

Also, a resin sheet (not shown) is bonded on an entire surface of the masking tape and the masking tape is then peeled off. Thereby, parts of the resin sheet arranged in the openings of the masking tape remain in an island form on the component mounting region.

Alternatively, instead of using the resin sheet as the first sealing resin material 30a, a liquid resin may be applied to the plurality of component mounting regions of the wiring substrate 5 by a dispenser or the like.

Figure 8:
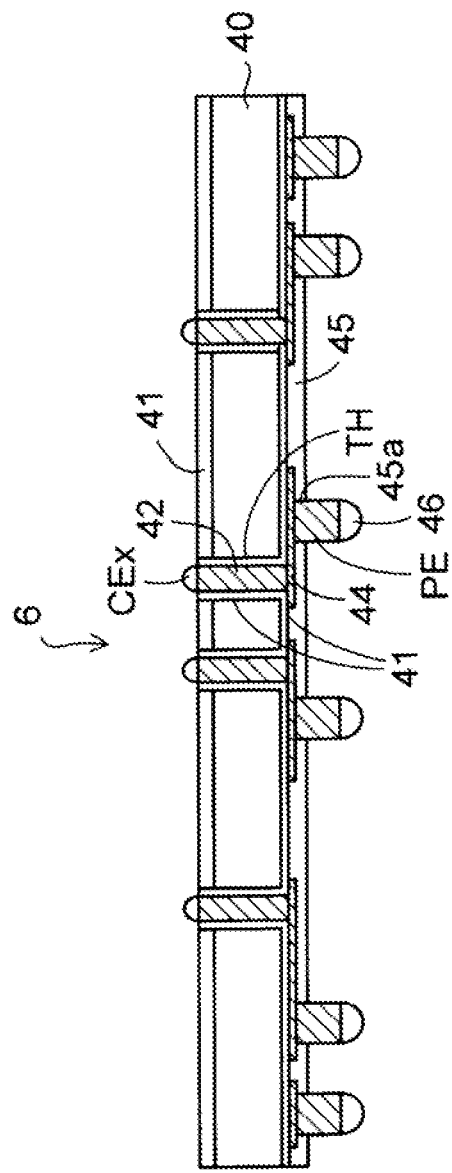
FIG. 8 is a sectional view depicting the manufacturing method of the electronic component device according to the exemplary embodiment (3 thereof).

Subsequently, as shown in FIG. 8, a first semiconductor chip 6 is prepared. The first semiconductor chip 6 is an example of the second electronic component, and is a CPU using a silicon substrate, for example.

In the first semiconductor chip 6, a chip substrate 40 made of silicon is formed with through-holes TH penetrating in a thickness direction thereof. Also, an insulating layer 41 is formed on inner surfaces of the through-holes TH and upper and lower surfaces of the chip substrate 40.

As the insulating layer 41, a silicon oxide layer (SiO$_2$ layer), a silicon nitride layer (SiN layer), a polyimide layer or the like is used. The through-hole TH is filled with a through-electrode 42 made of copper or copper alloy.

An upper end of the through-electrode 42 is formed with a connection electrode CEx such as a nickel/gold plating layer, a solder or the like.

Also, the lower surface of the chip substrate 40 is formed with a wiring layer 44 connected to lower ends of the through-electrodes 42. The wiring layer 44 is formed of aluminum, copper or alloy thereof. Also, the lower surface of the chip substrate 40 is formed with a passivation film 45 having openings 45a formed on connection parts of the wiring layer 44.

The passivation film 45 is formed of a silicon oxide layer, a silicon nitride layer, a polyimide resin or the like.

The connection parts of the wiring layer 44 are provided with upright columnar electrodes PE. A tip of the columnar electrode PE is formed with a round bump-shaped solder 46. The columnar electrode PE is made of copper or copper alloy, for example. Also, an arrangement pitch of the columnar electrodes PE of the first semiconductor chip 6 is 80 μm to 100 μm, for example.

In this way, the columnar electrodes PE provided on the lower surface-side of the first semiconductor chip 6 are electrically connected to the connection electrodes CEx provided on the upper surface-side via the wiring layer 44 and the through-electrodes 42, so that the upper and lower surface-sides are conductive to each other.

The lower surface-side of the first semiconductor chip 6 is an element formation surface, and the element formation surface is formed with a variety of elements such as a transistor, a capacitor, a resistance and the like (not shown), which are connected to a multilayered wiring to configure an electronic circuit.

The electronic circuit in the first semiconductor chip 6 is connected to the columnar electrodes PE via the wiring layer 44.

An area of the first sealing resin material 30a shown in FIG. 7 is set to be greater than an area of the first semiconductor chip 6. For example, the area of the first sealing resin material 30a is about 9 mm×9 mm, and the area of the first semiconductor chip 6 is about 6 mm×6 mm.

Figure 9:
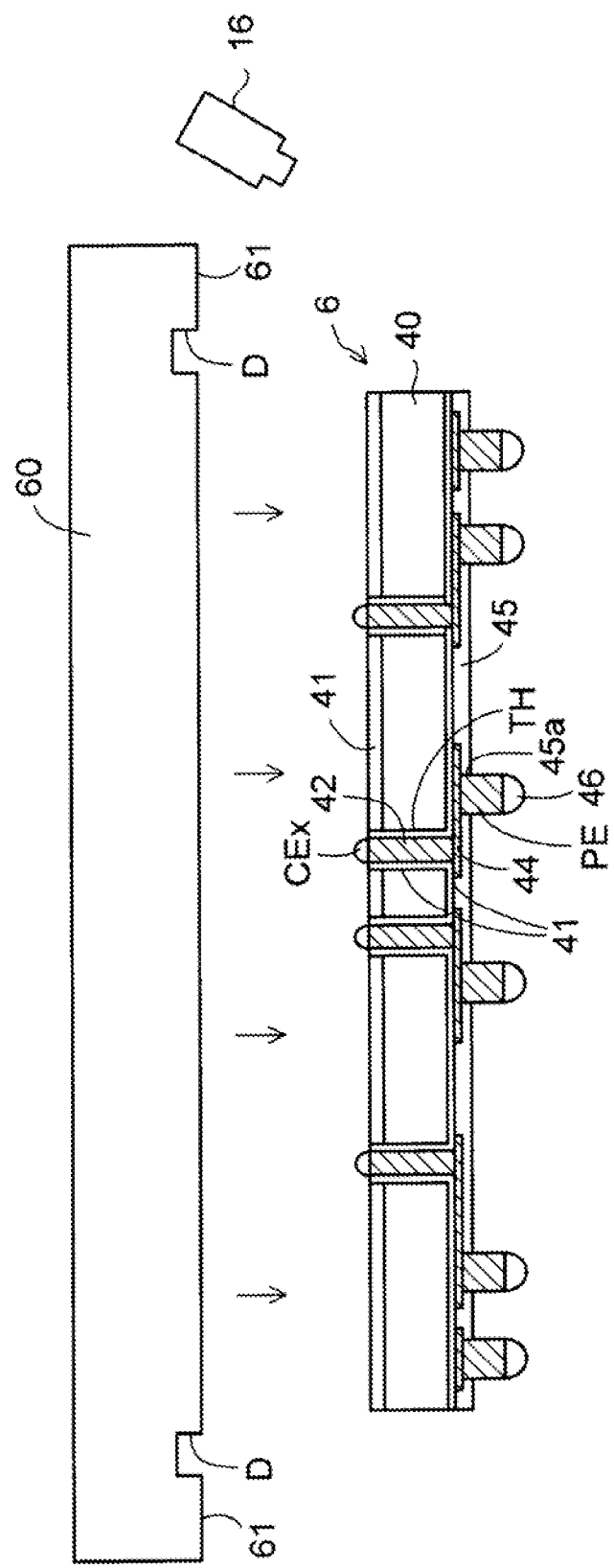
FIG. 9 is a sectional view depicting the manufacturing method of the electronic component device according to the exemplary embodiment (4 thereof).

Subsequently, as shown in FIG. 9, a first bonding tool 60 is prepared. The first bonding tool 60 is formed of metal, ceramics such as alumina, or the like. Also, the first bonding tool 60 has a plurality of suction holes (not shown) for sucking a work in a vacuum manner and a heating unit (not shown) configured by a heat generation resistor, an infrared lamp or the like.

Also, a peripheral edge portion 61 of the first bonding tool 60 is formed with hole-shaped concave portions D. The concave portions D formed at the peripheral edge portion 61 of the first bonding tool 60 are provided so as to form alignment marks in an underfill resin, as described later.

The first bonding tool 60 is connected to a moving mechanism (not shown), and is configured to move to a desired coordinate position in horizontal and vertical directions.

Also, an imaging camera 16 such as a CCD camera is arranged adjacent to the first bonding tool 60. Based on image recognition of the alignment mark and the like by the imaging camera 16, a coordinate position of the first bonding tool 60 is aligned.

Based on the image recognition of an outward appearance of the first semiconductor chip 6 disposed on a tray (not shown) by the imaging camera 16, the position of the first bonding tool 60 is aligned relative to the first semiconductor chip 6.

Figure 10:
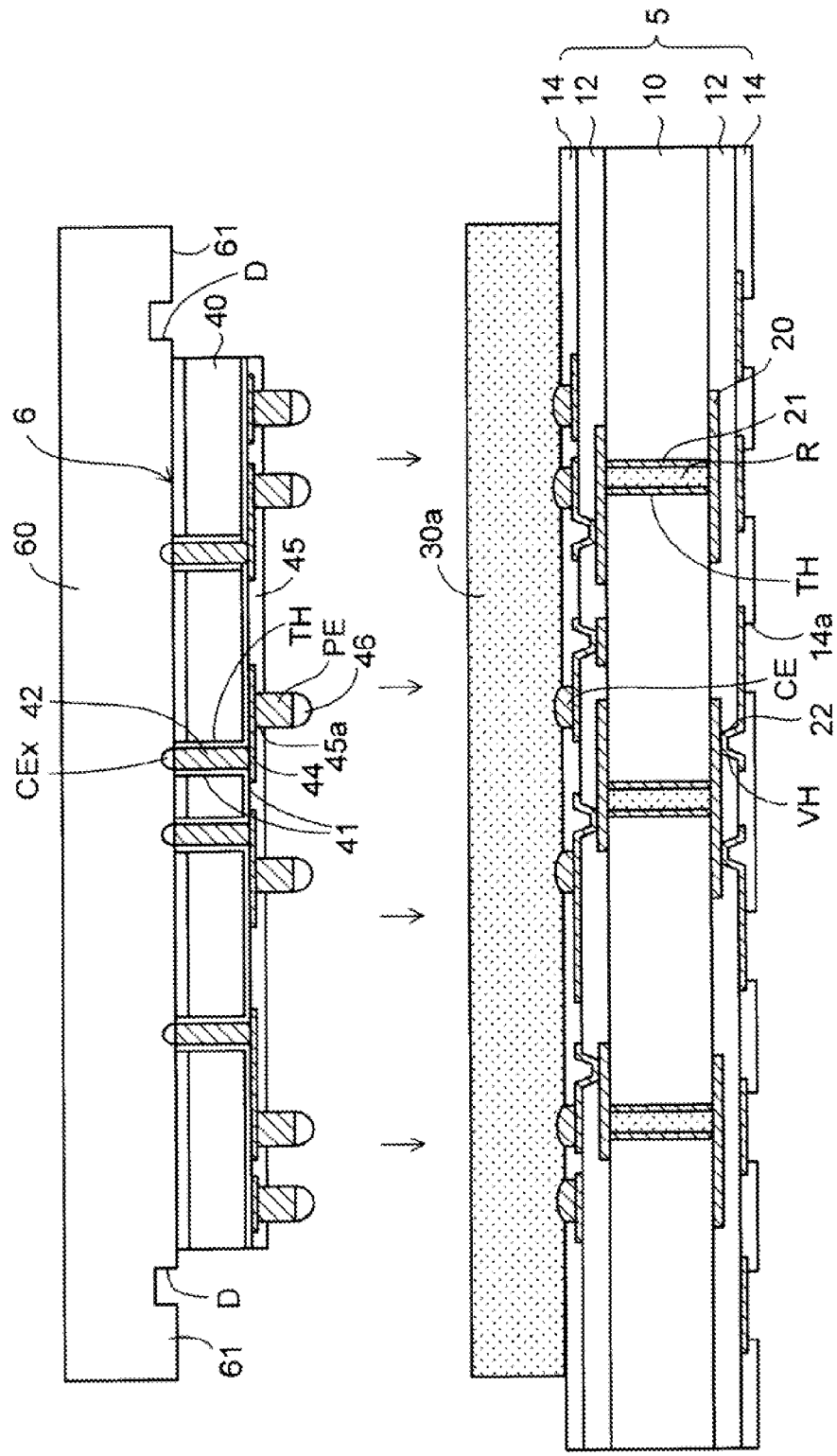
FIG. 10 is a sectional view depicting the manufacturing method of the electronic component device according to the exemplary embodiment (5 thereof).

Also, as shown in FIG. 10, the first bonding tool 60 is lowered to suck the first semiconductor chip 6 to the first bonding tool 60. An area of the first bonding tool 60 is set to be greater than the area of the first semiconductor chip 6, and is substantially the same as the area of the first sealing resin material 30a on the wiring substrate 5.

For this reason, the peripheral edge portion 61 and the concave portions D of the first bonding tool 60 are exposed outwards from side surfaces of the first semiconductor chip 6.

Since the position of the first bonding tool 60 is aligned relative to the first semiconductor chip 6, positions of the concave portions D of the first bonding tool 60 are also aligned relative to the first semiconductor chip 6.

Subsequently, as shown in FIG. 10, the wiring substrate 5 (refer to FIG. 7) having the first sealing resin material 30a formed thereon is arranged on a bonding stage (not shown), and the wiring substrate 5 is heated to about 100° C. to soften the first sealing resin material 30a.

Then, based on the image recognition of the alignment marks (not shown) of the wiring substrate 5 by the imaging camera 16, the position of the first semiconductor chip 6 sucked to the first bonding tool 60 is aligned relative to the wiring substrate 5.

Then, the columnar electrodes PE of the first semiconductor chip 6 sucked to the first bonding tool 60 are pushed into the first sealing resin material 30a on the wiring substrate 5.

Figure 11:
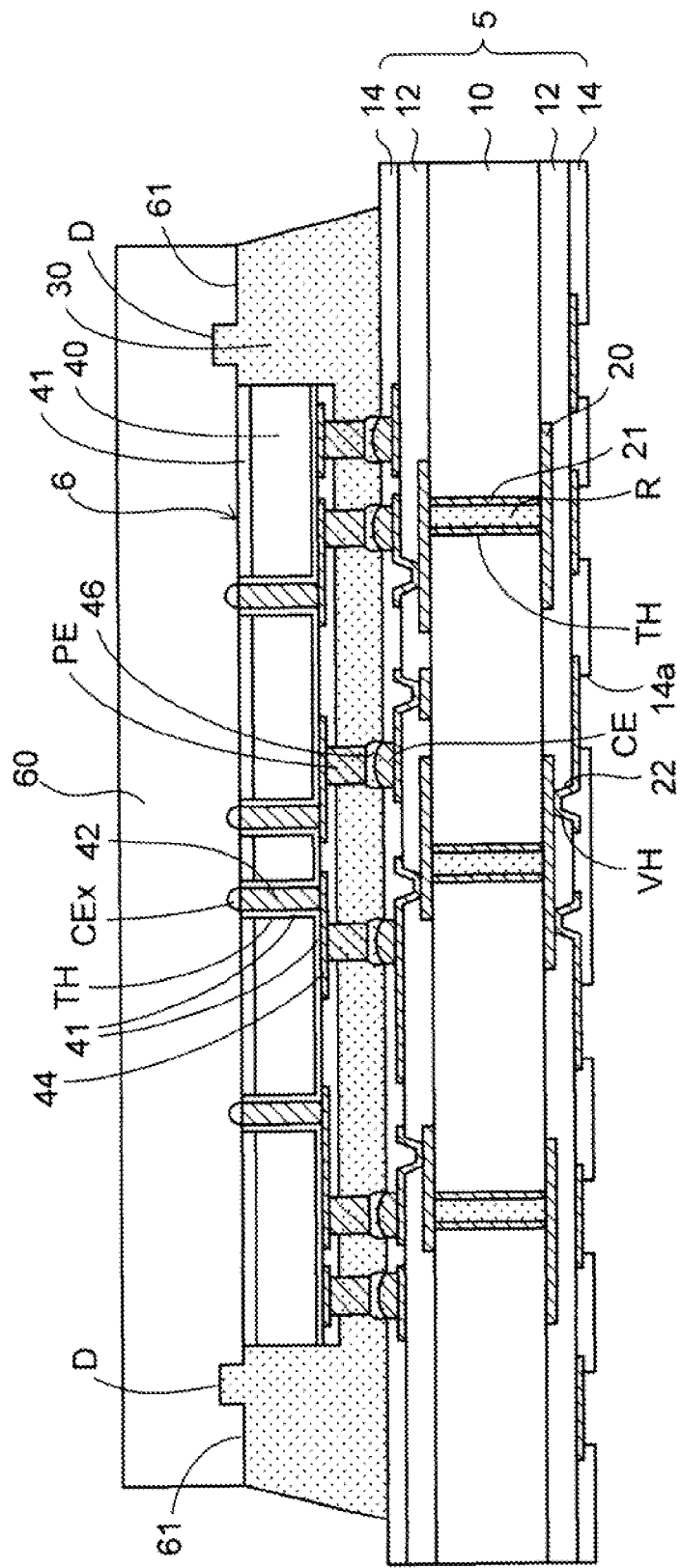
FIG. 11 is a sectional view depicting the manufacturing method of the electronic component device according to the exemplary embodiment (6 thereof).

Thereby, as shown in FIG. 11, the columnar electrodes PE of the first semiconductor chip 6 are pressure-contacted to the connection electrodes CE of the wiring substrate 5 via the solders 46. Subsequently, the reflow heating is performed from the first bonding tool 60, so that the solders 46 are melted to flip-chip connect the columnar electrodes PE of the first semiconductor chip 6 to the connection electrodes CE of the wiring substrate 5 through the solder 46.

As the solder 46, lead-free solder such as tin/silver-based solder, tin/silver/copper-based solder or the like is used, for example. The reflow temperature is set to about 260° C.

When performing the reflow heating, the first semi-cured sealing resin material 30a is also cured at the same time, and a first cured underfill resin 30 is formed below the first semiconductor chip 6.

At this time, the first sealing resin material 30a in a region outside the first semiconductor chip 6 is pressed and molded by a lower surface of the peripheral edge portion 61 of the first bonding tool 60. Also, the concave portions D of the peripheral edge portion 61 of the first bonding tool 60 are filled with the first sealing resin material 30a.

Figure 12:
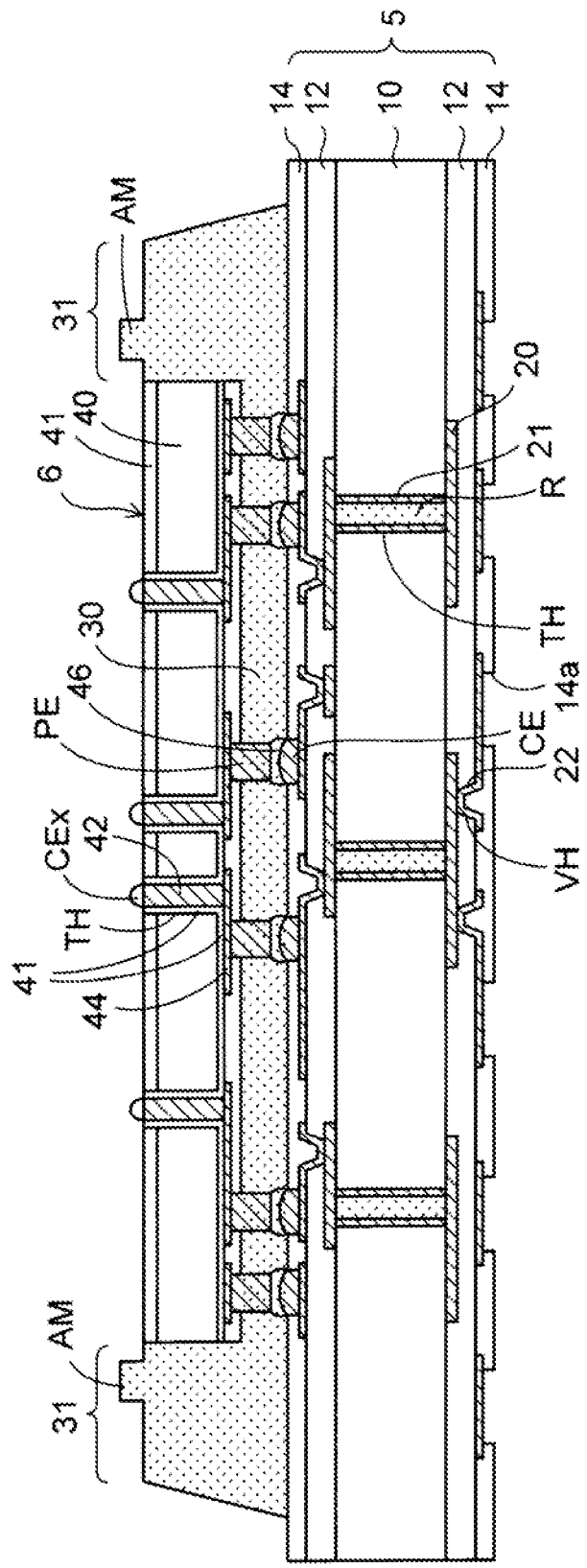
FIG. 12 is a sectional view depicting the manufacturing method of the electronic component device according to the exemplary embodiment (7 thereof).

Thereafter, as shown in FIG. 12, the first bonding tool 60 is removed from the first semiconductor chip 6. In this way, the first underfill resin 30 is filled between the first semiconductor chip 6 and the wiring substrate 5. At the same time, the first underfill resin 30 has an annular base part 31 in a region surrounding the first semiconductor chip 6.

Also, the base part 31 of the first underfill resin 30 is formed to have convex alignment marks AM on an upper surface thereof, which are obtained by the concave portions D of the first bonding tool 60.

The upper surface of the base part 31 except for the alignment marks AM of the first underfill resin 30 is arranged to be flush with the upper surface of the first semiconductor chip 6.

Figure 13:
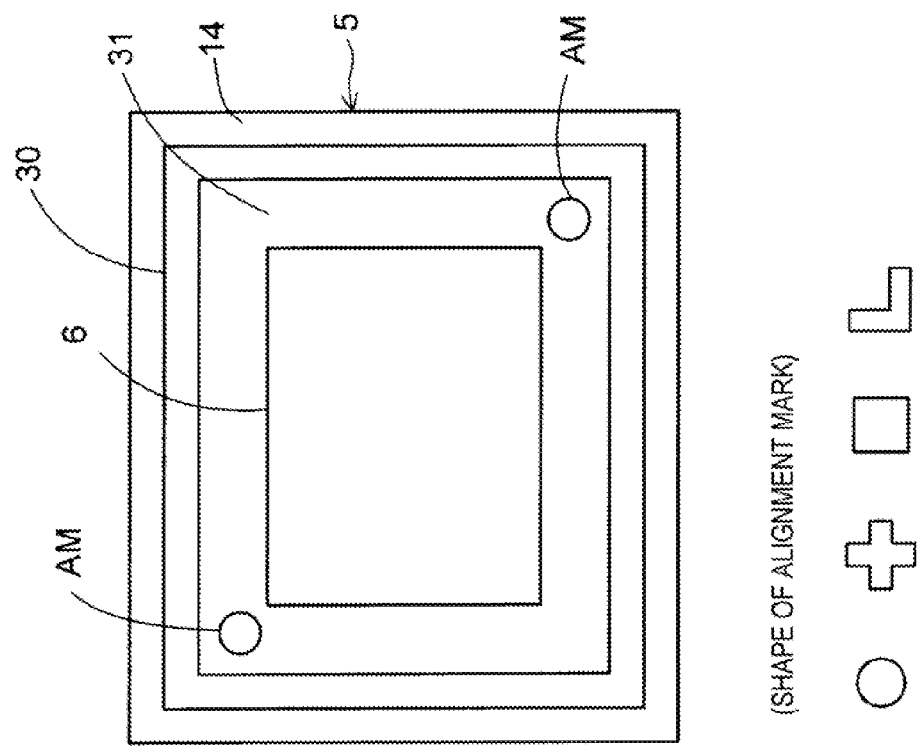
FIG. 13 is a reduced plan view of FIG. 12, as seen from above.

FIG. 13 is a reduced plan view of FIG. 12. In FIG. 13, the connection electrodes CEx of the first semiconductor chip 6 and the like are not shown.

As shown in FIG. 13, the first semiconductor chip 6 has a rectangular shape, as seen from above, and the alignment marks AM are arranged on the base part 31 of the underfill resin 30 at least in a region outside a pair of apexes on a diagonal line of the first semiconductor chip 6. Alternatively, the alignment marks may be arranged on the base part 31 of the underfill resin 30 in a region outside four corners of the first semiconductor chip 6 having a rectangular shape.

As shown in a lower part of FIG. 13, the alignment mark AM is formed to have a cross shape, a rectangular shape, a L shape or the like, in addition to a circular shape, as seen from above. When the alignment mark AM has a circular shape, a diameter of the alignment mark AM is 50 μm to 100 μm, and a height thereof is 5 μm to 20 μm.

In this way, a fillet part is formed so that most of the resin is arranged at the fillet part of the first underfill resin 30. Thereby, the base part 31 and the alignment marks AM of the first underfill resin 30 are formed around the first semiconductor chip 6.

An area of the first underfill resin 30 including the base part 31 is about 12 mm×12 mm.

As described above, when sucking the first semiconductor chip 6 to the first bonding tool 60, the concave portions D of the peripheral edge portion 61 of the first bonding tool 60 are arranged with being position-aligned relative to the first semiconductor chip 6. At this state, the sealing resin material 30s is filled in the concave portions D of the first bonding tool 60, so that the alignment marks AM are arranged.

Therefore, since the alignment marks AM formed in the first underfill resin 30 are arranged with being position-aligned relative to the first semiconductor chip 6, the alignment marks can be used as reference marks for determining an arrangement position of the first semiconductor chip 6.

Figure 14:
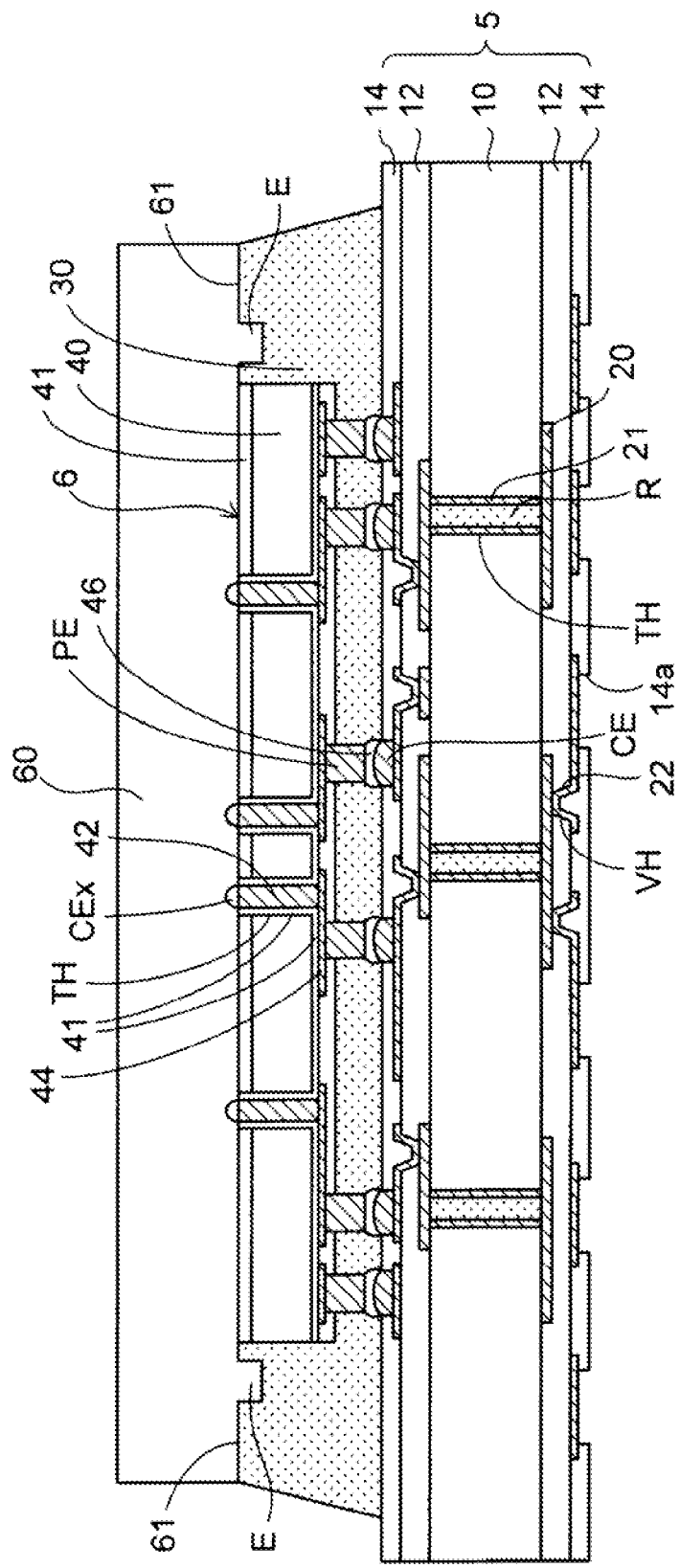
FIG. 14 is a sectional view depicting the manufacturing method of the electronic component device according to the exemplary embodiment (8 thereof), more specifically, depicting another method of forming an alignment mark.
Figure 15:
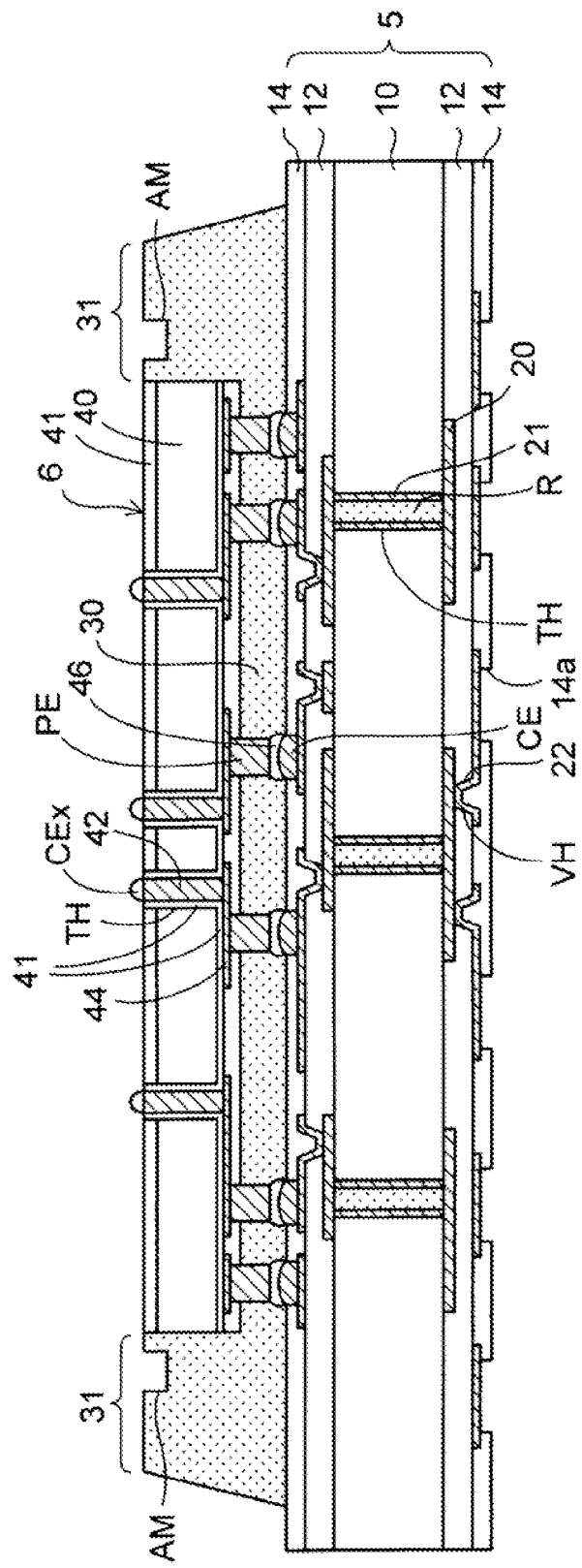
FIG. 15 is a sectional view depicting the manufacturing method of the electronic component device according to the exemplary embodiment (9 thereof), more specifically, depicting the other method of forming an alignment mark.

FIGS. 14 and 15 depict other methods of forming the alignment mark AM. As shown in FIG. 14, the peripheral edge portion 61 of the first bonding tool 60 may be formed with convex portions E, contrary to the first bonding tool 60 of FIG. 9.

Then, like FIG. 10, the columnar electrodes PE of the first semiconductor chip 6 sucked to the first bonding tool 60 are flip-chip connected to the connection electrodes CE of the wiring substrate 5 via the first sealing resin material 30a. At the same time, the first underfill resin 30 is formed between the first semiconductor chip 6 and the wiring substrate 5.

Thereafter, as shown in FIG. 15, the first bonding tool 60 is removed from the first semiconductor chip 6. Thereby, the concave alignment marks AM are formed in the upper surface of the base part 31 of the first underfill resin 30.

Like this, if the alignment mark AM is formed to have a step so that it can be clearly image-recognized by the imaging camera 16, the upper surface of the base part 31 of the first underfill resin 30 may be formed with the convex portions or the concave portions.

The subsequent processes are described with reference to a structure having the convex alignment marks AM shown in FIG. 12.

Figure 16:
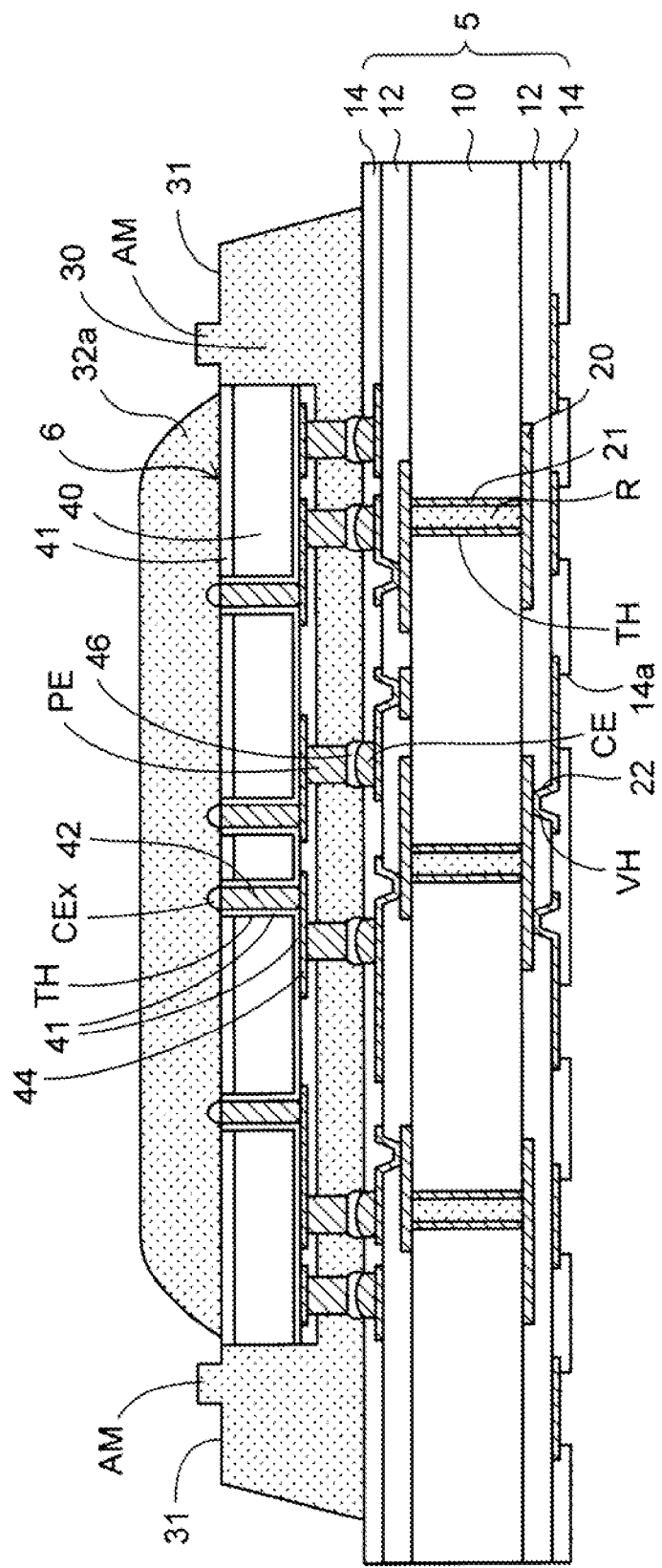
FIG. 16 is a sectional view depicting the manufacturing method of the electronic component device according to the exemplary embodiment (10 thereof).

Subsequently, as shown in FIG. 16, a second sealing resin material 32a is formed on the first semiconductor chip 6 of the structure shown in FIG. 12. In this process, a liquid resin is partially applied onto the region of the first semiconductor chip 6 by a dispenser or the like so that it does not cover the alignment marks AM formed on the base part 31 of the first underfill resin 30.

When a sealing resin material having a high content rate of filler is used so as to lower a coefficient of thermal expansion, it is difficult to recognize the alignment marks AM by the image recognition through the sealing resin material because of the low transparency. For this reason, when a sealing resin material having low transparency is used, the sealing resin material is formed so that the alignment marks AM are exposed.

Alternatively, instead of the liquid resin, a resin sheet may be bonded so that the alignment marks AM are exposed. In this case, like the process of FIG. 7, a masking tape (not shown) having an opening on each first semiconductor chip 6 is bonded, a large resin sheet (not shown) is bonded to an entire surface of the masking tape and the masking tape is then peeled off.

Thereby, parts of the resin sheet arranged in the openings of the masking tape remain in an island form on each first semiconductor chip 6.

Alternatively, when a sealing resin material having a low content rate of filler and having high transparency is used, the sealing resin material may be formed on the first semiconductor chip 6 with covering the alignment marks AM.

Figure 17:
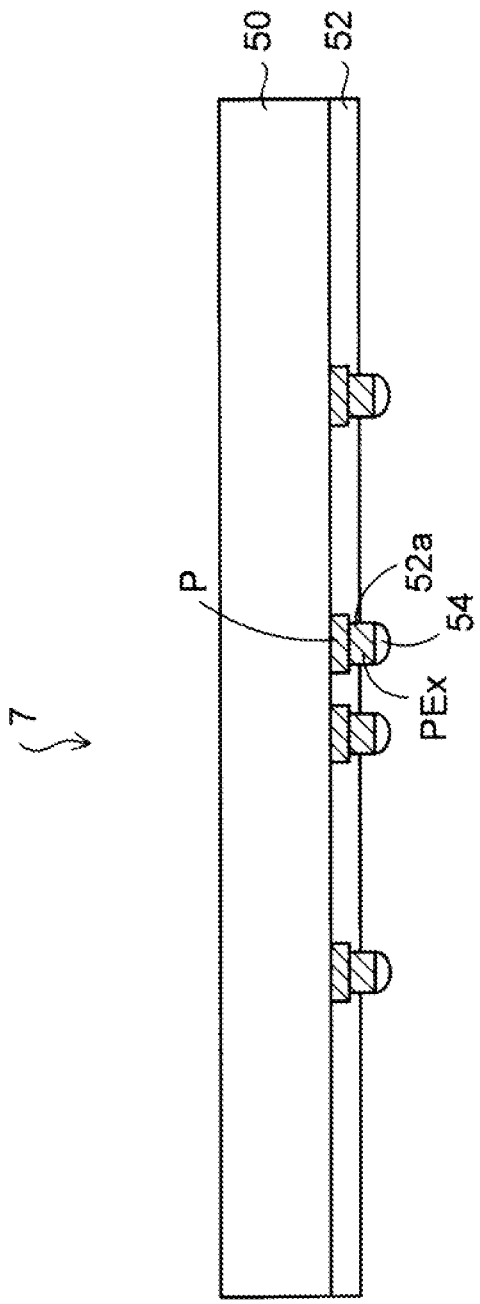
FIG. 17 is a sectional view depicting the manufacturing method of the electronic component device according to the exemplary embodiment (11 thereof).

Then, as shown in FIG. 17, a second semiconductor chip 7 to be stacked on the first semiconductor chip 6 is prepared. The second semiconductor chip 7 is an example of the third electronic component, and is a memory chip using a silicon substrate, for example. An area of the second semiconductor chip 7 is set to be greater than the area of the first semiconductor chip 6.

Also, the area of the second semiconductor chip 7 is set to be smaller than the area of the first underfill resin 30 including the base part 31.

In the second semiconductor chip 7, connection pads P are formed on an element formation surface of a lower surface-side of a chip substrate 50 made of silicon. The second semiconductor chip 7 has an electronic circuit in the element formation surface, and the connection pads P are connected to the electronic circuit, like the first semiconductor chip 6.

Also, a passivation film 52 having openings 52a arranged on the connection pads P is formed on the element formation surface-side, as the outermost layer. The passivation film 52 is formed of a silicon oxide layer, a silicon nitride layer, a polyimide resin or the like.

Also, a columnar electrode PEx provided upright outward from the passivation film 52 is connected to the connection pad P, and a tip of the columnar electrode PEx is formed with a solder 54. The columnar electrode PEx is formed of copper or copper alloy, for example.

Figure 18:
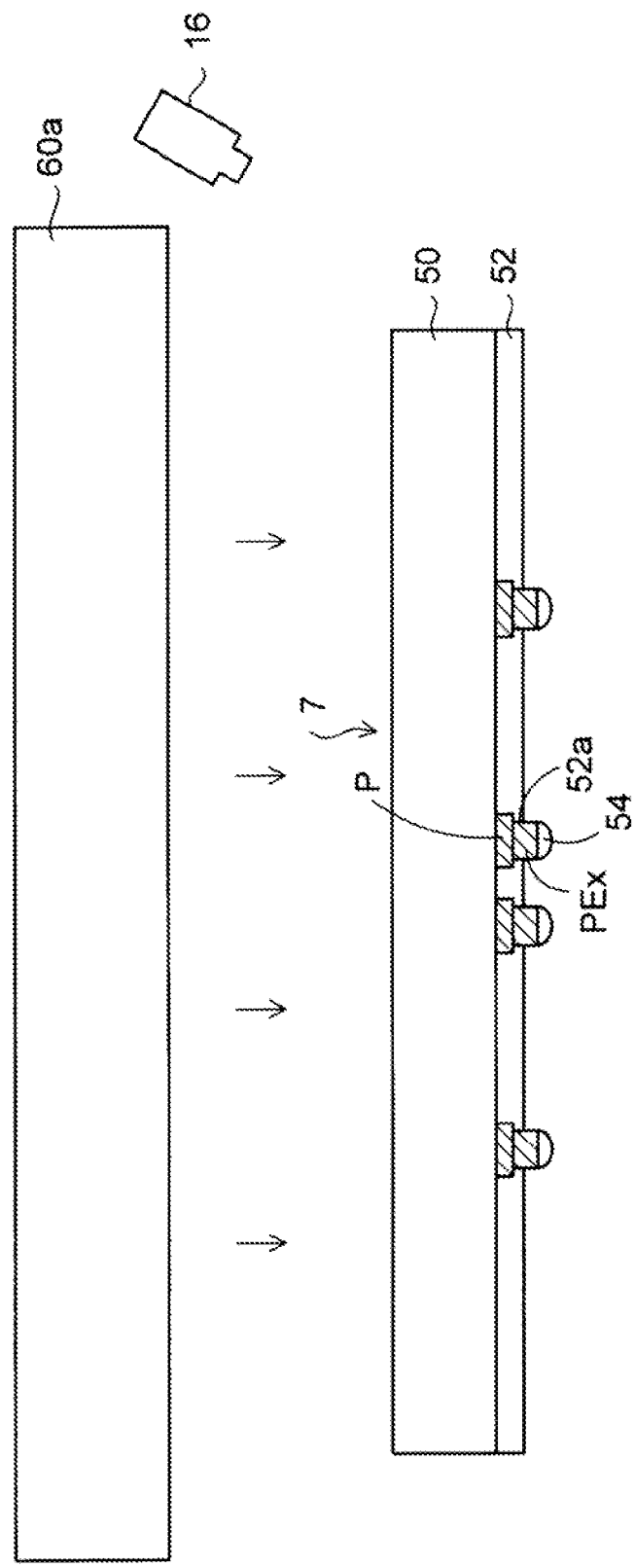
FIG. 18 is a sectional view depicting the manufacturing method of the electronic component device according to the exemplary embodiment (12 thereof).

Subsequently, as shown in FIG. 18, a second bonding tool 60a is prepared. Also, based on image recognition of an outer periphery of the second semiconductor chip 7 arranged on a tray (not shown) by the imaging camera 16, a position of the second bonding tool 60a is aligned relative to the second semiconductor chip 7.

Figure 19:
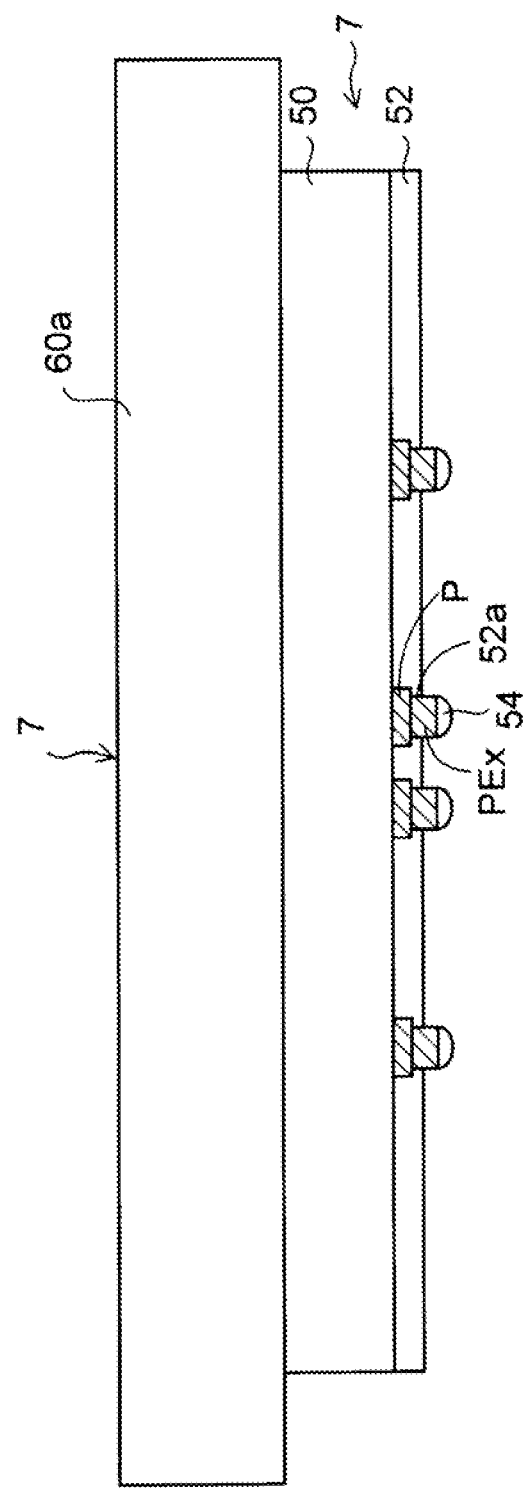
FIG. 19 is a sectional view depicting the manufacturing method of the electronic component device according to the exemplary embodiment (13 thereof).

Then, as shown in FIGS. 18 and 19, the second bonding tool 60a is lowered to suck a backside of the semiconductor chip 7 to the second bonding tool 60a. Thereby, the second semiconductor chip 7 is aligned and sucked to a desired position of the second bonding tool 60a.

Figure 20:
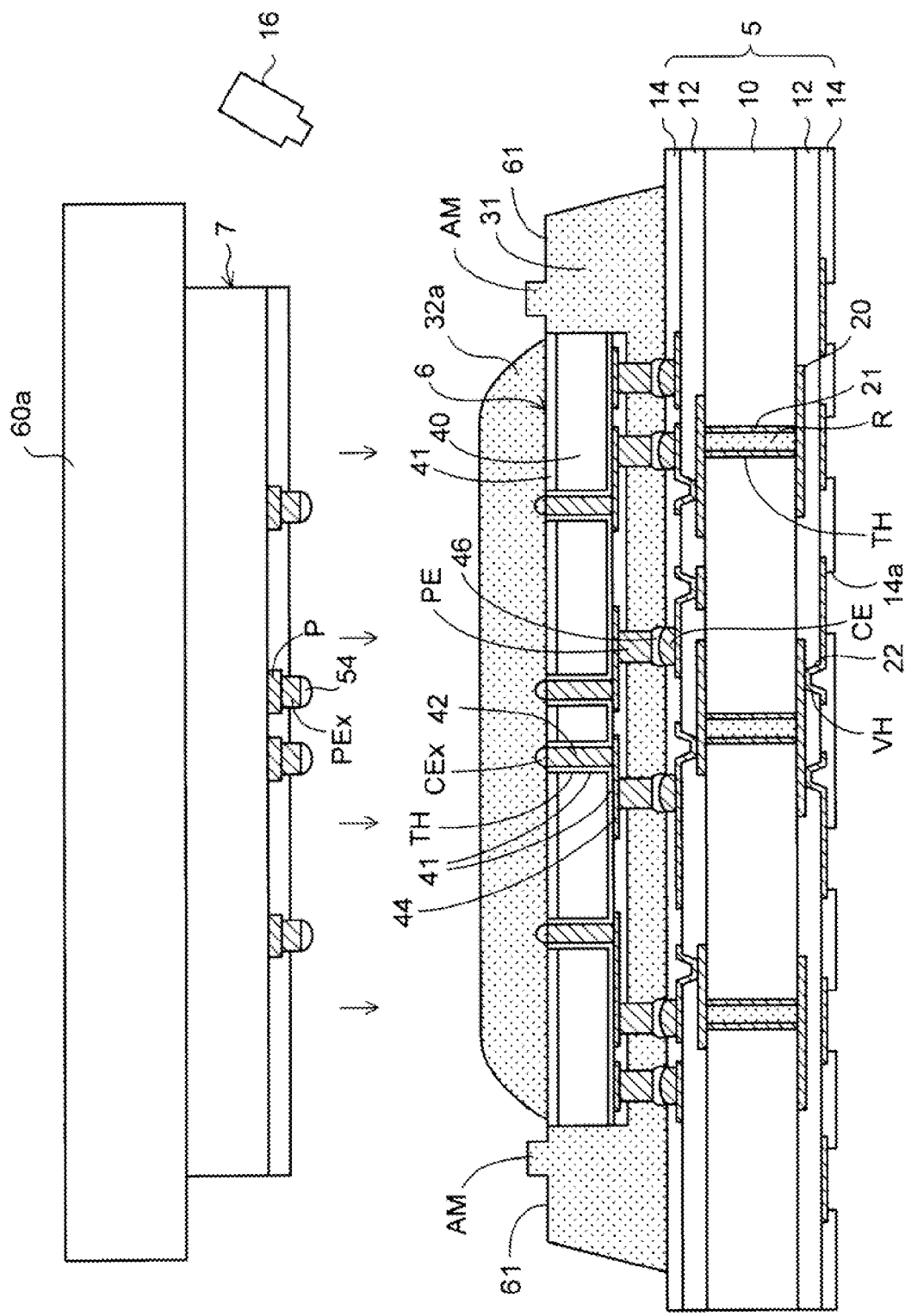
FIG. 20 is a sectional view depicting the manufacturing method of the electronic component device according to the exemplary embodiment (14 thereof).

Subsequently, as shown in FIG. 20, the second semiconductor chip 7 sucked to the second bonding tool 60a (refer to FIG. 19) is arranged above the structure of FIG. 16. Then, the columnar electrodes PEx of the second semiconductor chip 7 are image-recognized as alignment marks by the imaging camera 16.

Also, the alignment marks AM of the base part 31 of the underfill resin 30 of the structure shown in FIG. 16 are image-recognized by the imaging camera 16. Based on this, the position of the second semiconductor chip 7 sucked to the second bonding tool 60a is aligned relative to the first semiconductor chip 6 on the wiring substrate 5.

At this time, since the alignment mark AM is configured by the convex portion of the base part 31 of the first underfill resin 30, it is possible to clearly image-recognize the alignment mark AM by the imaging camera 16. For this reason, it is possible to perform the position alignment without fail of the position alignment, which is caused when the alignment mark AM cannot be image-recognized.

Thereby, it is not necessary to use an alignment mark that is to be arranged at the peripheral edge portion of the backside of the first semiconductor chip 6 and is difficult to be image-recognized. Also, it is not necessary to form an alignment mark on the backside of the first semiconductor chip 6.

Figure 21:
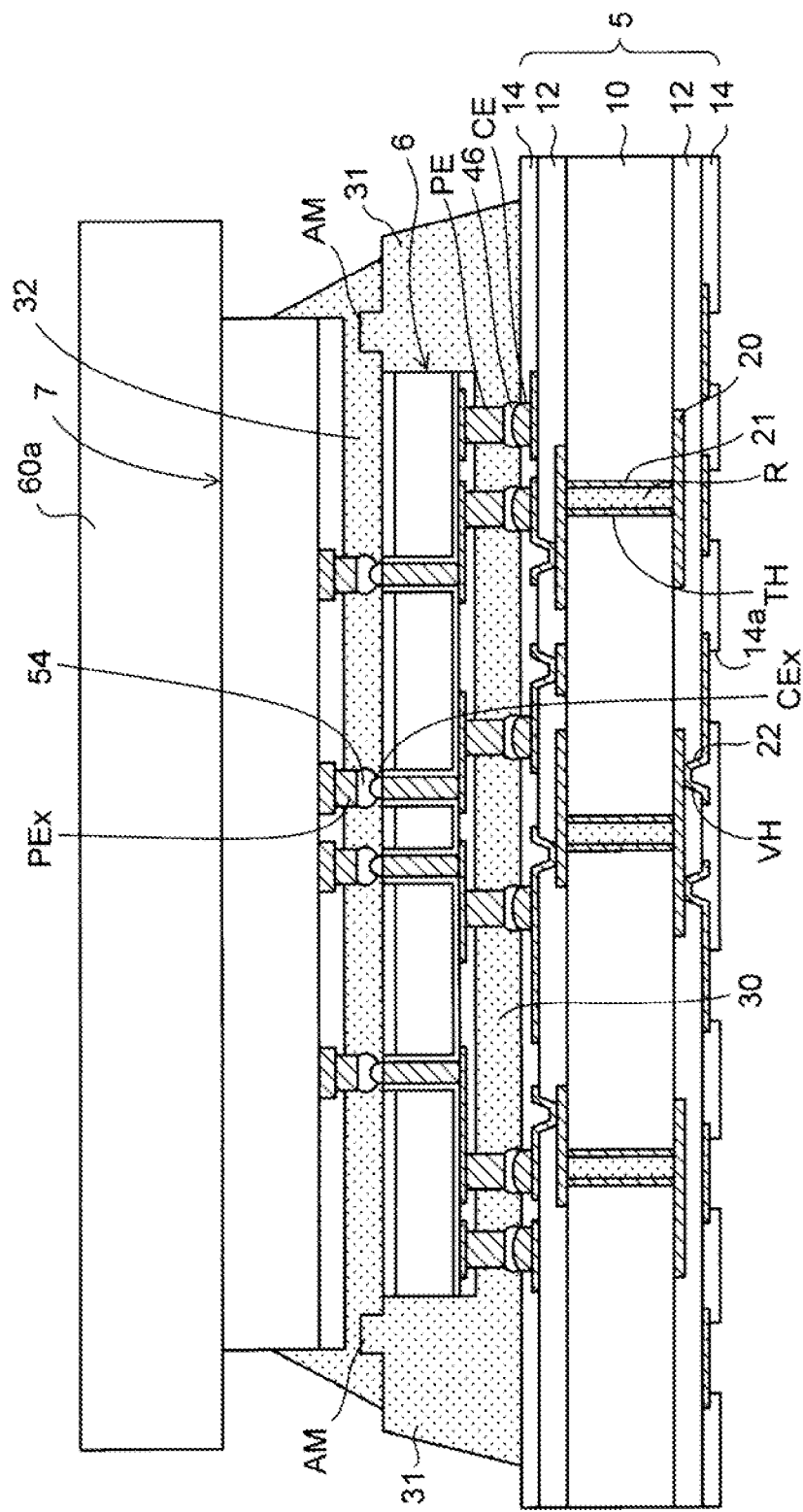
FIG. 21 is a sectional view depicting the manufacturing method of the electronic component device according to the exemplary embodiment (15 thereof).

Then, as shown in FIGS. 20 and 21, the columnar electrodes PEx of the second semiconductor chip 7 sucked to the second bonding tool 60a are pushed into the second sealing resin material 32a on the first semiconductor chip 6 of the structure shown in FIG. 16.

Thereby, as shown in FIG. 21, the columnar electrodes PEx of the second semiconductor chip 7 are pressure-contacted and flip-chip connected to the connection electrodes CEx of the first semiconductor chip 6 via the solders 54. Subsequently, the reflow heating is performed from the second bonding tool 60a, so that the solders 54 are melted to bond the columnar electrodes PEx of the second semiconductor chip 7 to the connection electrodes CEx of the first semiconductor chip 6 through the solders 54.

Thereby, the second sealing resin material 32a is cured at the same time, so that a second underfill resin 32 is filled between the second semiconductor chip 7 and the first semiconductor chip 6 and first underfill resin 30.

At this time, when pushing the second semiconductor chip 7 into the second sealing resin material 32a, the second sealing resin material 32a covers the side surfaces of the second semiconductor chip 7 while flowing on the base part 31 and the alignment marks AM of the first underfill resin 30.

In this way, the second underfill resin 32 is formed up to the side surfaces of the second semiconductor chip 7 with covering the base part 31 and the alignment marks AM of the first underfill resin 30.

Thereby, even when the area of the second semiconductor chip 7 is greater than the area of the first semiconductor chip 6, it is possible to securely seal the side surfaces of the second semiconductor chip 7 by the second underfill resin 32.

Figure 22:
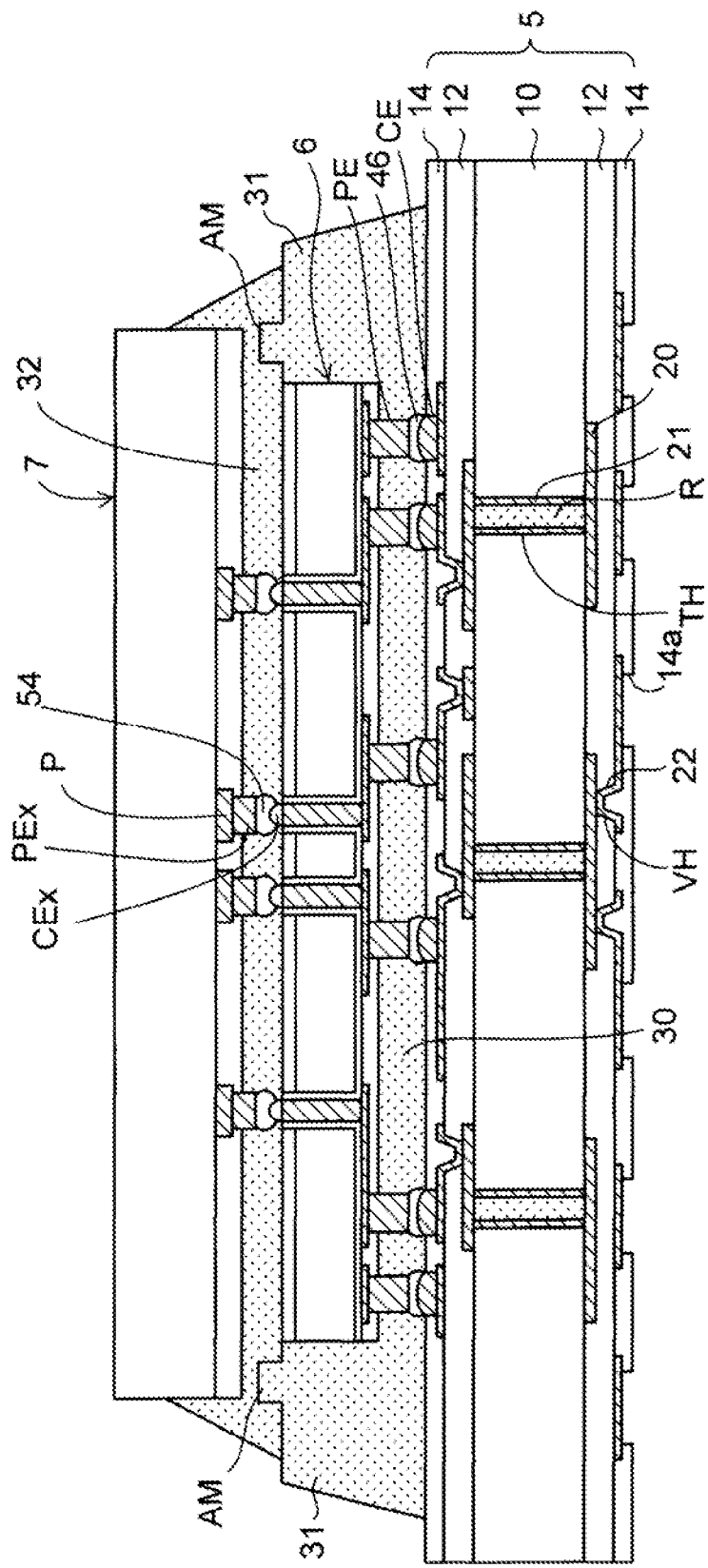
FIG. 22 is a sectional view depicting the manufacturing method of the electronic component device according to the exemplary embodiment (16 thereof).

Thereafter, as shown in FIG. 22, the second bonding tool 60a is removed from the second semiconductor chip 7.

Figure 23:
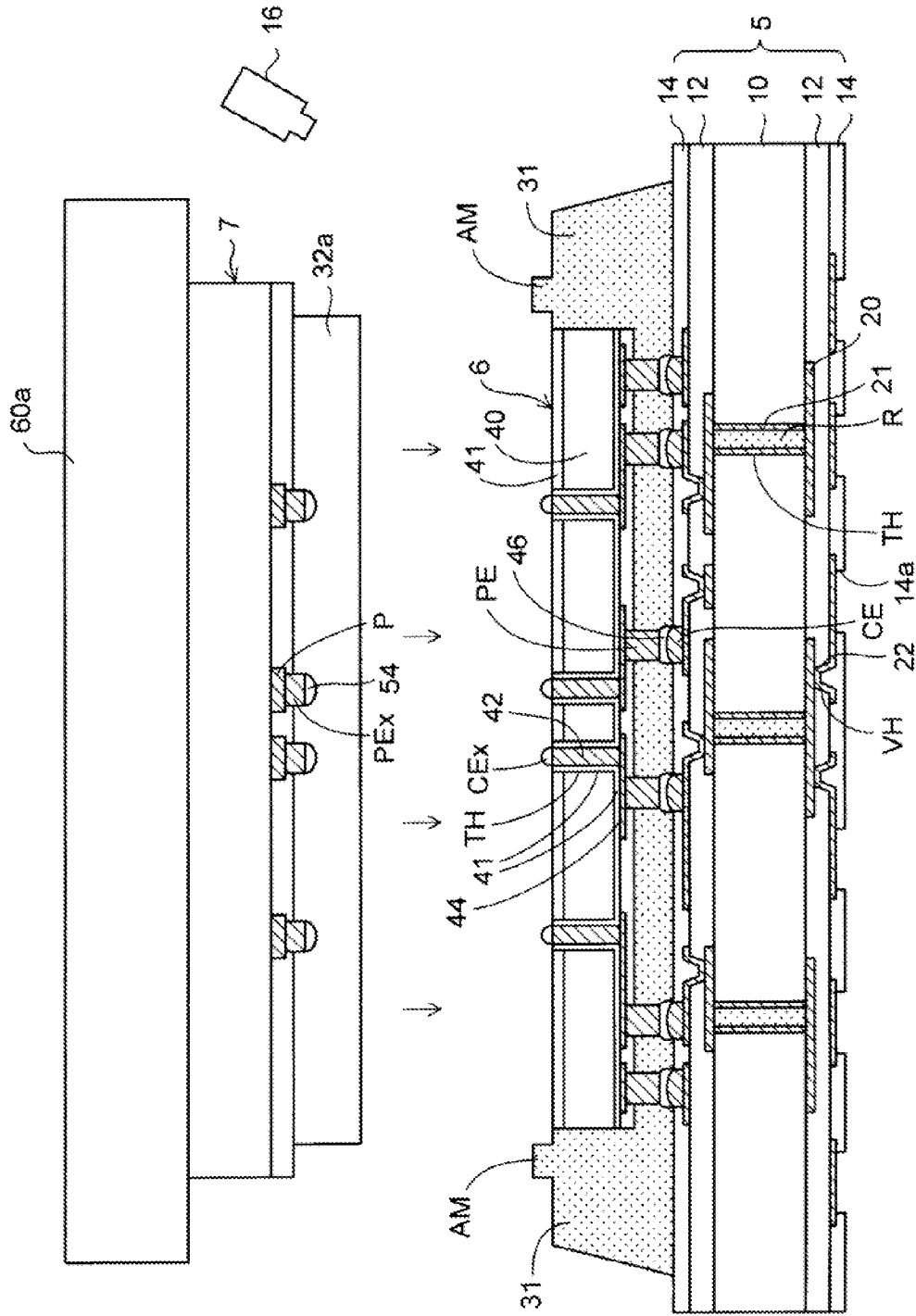
FIG. 23 is a sectional view depicting the manufacturing method of the electronic component device according to the exemplary embodiment (17 thereof), more specifically, depicting another method of forming a second underfill resin.

FIGS. 23 and 24 depict other methods of forming the second underfill resin 32. FIG. 23 depicts a configuration where the sealing resin material is formed on the element formation surface of the second semiconductor chip 7, instead of the backside of the first semiconductor chip 6. As shown in FIG. 23, the second semi-cured sealing resin material 32a is bonded to the element formation surface of the second semiconductor chip 7.

In this configuration, when image recognizing the columnar electrodes PEx of the second semiconductor chip 7 as the alignment marks by the imaging camera 16, the image recognition is performed through the second sealing resin material 32a. For this reason, since the columnar electrodes PEx of the second semiconductor chip 7 are clearly image-recognized as the alignment marks, a transparent resin is used as the second sealing resin material 32a.

Then, like the process of FIG. 21, the second semiconductor chip 7 is flip-chip connected to the first semiconductor chip 6 via the second sealing resin material 32a. Thereby, the same structure as FIG. 22 is obtained.

Also, FIG. 24 depicts a method of forming the second underfill resin 32 without providing the sealing resin material to the first or second semiconductor chip in advance. As shown in FIG. 24, the columnar electrodes PEx of the second semiconductor chip 7 are flip-chip connected to the connection electrodes CEx of the first semiconductor chip 6 without the sealing resin material.

Thereafter, the second underfill resin 32 may be filled in gaps between the second semiconductor chip 7 and the first semiconductor chip 6 and the base part 31 of the first underfill resin 30.

In this case, since the resin can be applied from a dispenser 18 to the base part 31 of the first underfill resin 30, it is possible to securely seal the side surfaces of the second semiconductor chip 7 by the second underfill resin 32, like FIG. 21.

Then, as shown in FIG. 25, a mold resin 34 such as an epoxy resin is formed on the wiring substrate 5 and the second semiconductor chip 7, and regions ranging from the side surfaces of the first and second underfill resin 30, 32 to the upper surface of the second semiconductor chip 7 are sealed by the resin.

In the meantime, when the first and second semiconductor chips 6, 7 are sufficiently protected by the first and second underfill resins 30, 32, the mold resin 34 may be omitted.

Also, solder balls are mounted to the connection parts of the second wiring layer 22 on the lower surface-side of the wiring substrate 5, so that external connection terminals T are formed. Then, the wiring substrate 5 is cut so as to obtain each component mounting region in which the first semiconductor chip 6 and the second semiconductor chip 7 are stacked.

By the above processes, an electronic component device 1 of the exemplary embodiment is manufactured.

As shown in FIG. 25, in the electronic component device 1 of the exemplary embodiment, the columnar electrodes PE of the first semiconductor chip 6 shown in FIG. 8 are flip-chip connected to the connection electrodes CE on the upper surface-side of the wiring substrate 5 shown in FIG. 6, via the solders 46.

The first underfill resin 30 is filled between the first semiconductor chip 6 and the wiring substrate 5. The first underfill resin 30 also has the annular base part 31 extending from the region between the first semiconductor chip 6 and the wiring substrate 5 towards the region around the first semiconductor chip 6.

Also, the first underfill resin 30 is formed so that the upper surface of the base part 31 has the alignment marks AM consisting of the convex portions.

The base part 31 and the alignment marks AM of the first underfill resin 30 are integrally formed. As described above, the base part 31 and the alignment marks AM of the first underfill resin 30 are formed as the first sealing resin material 30a is molded by the lower surface of the peripheral edge portion 61 having the concave portions D of the first bonding tool 60.

Alternatively, the upper surface of the base part 31 of the first underfill resin 30 may be formed with the alignment marks AM consisting of the concave portions.

Also, the columnar electrodes PEx of the second semiconductor chip 7 are flip-chip connected to the connection electrodes CEx on the upper surface-side of the first semiconductor chip 6 shown in FIG. 17, via the solders 54. The position of the second semiconductor chip 7 is aligned relative to the first semiconductor chip 6 on the basis of the image recognition of the alignment marks AM of the first underfill resin 30 by the imaging camera 16.

Also, the second underfill resin 32 is filled between the first semiconductor chip 6 and the second semiconductor chip 7. The second underfill resin 32 extends from the region between the first semiconductor chip 6 and the second semiconductor chip 7 towards the above of the base part 31 and the alignment mark AM of the first underfill resin 30, thereby sealing the side surfaces of the second semiconductor chip 7.

The side surfaces of the device formation region of the lower surface-side of the second semiconductor chip 7 are preferably sealed at least by the second underfill resin 32, and the side surfaces close to the backside of the second semiconductor chip 7 may be exposed.

The area of the second semiconductor chip 7 is set to be greater than the area of the first semiconductor chip 6. The base part 31 of the first underfill resin 30 is arranged around the first semiconductor chip 6, and the side surfaces of the second semiconductor chip 7 are arranged in the regions between the side surfaces of the first semiconductor chip 6 and the side surfaces of the base part 31 of the first underfill resin 30.

For this reason, it is possible to securely seal the side surfaces of the second semiconductor chip 7 by the second underfill resin 32 leaked out from the above of the first semiconductor chip 6 to the base part 31.

Alternatively, the base part 31 of the first underfill resin 30 may be made to further extend outward to thicken the second sealing resin material 32a, thereby sealing the entire side surfaces of the second semiconductor chip 7 by the second underfill resin 32.

Like this, in the electronic component device 1 of the exemplary embodiment, the base part 31 of the first underfill resin 30 is arranged around the first semiconductor chip 6. For this reason, even when the second semiconductor chip 7 having the area greater than the first semiconductor chip 6 is flip-chip connected on the first semiconductor chip 6, it is possible to arrange the second underfill resin 32 on the base part 31 of the first underfill resin 30.

Thereby, it is possible to seal the side surfaces of the second semiconductor chip 7, which are disposed at the outermore sides than the side surfaces of the first semiconductor chip 6, by the second underfill resin 32.

As a result, it is possible to securely seal the side surfaces of the device formation region of the second semiconductor chip 7 by the second underfill resin 32. Therefore, the moisture is prevented from being introduced into the electronic circuit of the second semiconductor chip 7, so that it is possible to prevent the problems such as degradation, failure and the like.

Also, the alignment marks AM functioning as the reference positions of the first semiconductor chip 6 and having the convex or concave shape are integrally formed on the upper surface of the base part 31 of the first underfill resin 30. For this reason, since it is possible to clearly image-recognize the alignment marks AM by the imaging camera 16, the second semiconductor chip 7 is stably position-aligned and mounted to the first semiconductor chip 6.

Since it is not necessary to use an alignment mark, which is arranged at the peripheral edge portion of the backside of the first semiconductor chip 6 and is difficult to be image-recognized, it is possible to manufacture the electronic component device in good yield without the fail of the position alignment.

Other Exemplary Embodiments

In the above exemplary embodiment, the first semiconductor chip 6 and the second semiconductor chip 7 are stacked in order with being flip-chip connected on the wiring substrate 5. In addition to this, a semiconductor chip may be adopted instead of the wiring substrate 5, and three semiconductor chips may be stacked to form the same configuration.

Alternatively, instead of the first semiconductor chip 6, other wiring substrate such as a silicon interposer may be adopted, and the other wiring substrate and the semiconductor chips may be stacked on the wiring substrate, thereby forming the same configuration.

Also, instead of the first semiconductor chip 6 and the second semiconductor chip 7, a variety of wiring substrates may be adopted, and three wiring substrates may be stacked to form the same configuration.

What is claimed is:

1. An electronic component device comprising:
a first electronic component;
a second electronic component disposed on and connected to the first electronic component;
a first underfill resin filled between the first electronic component and the second electronic component, the first underfill resin having a base part arranged around the second electronic component and an alignment mark formed on an up surface of the base part, wherein, except for the alignment mark, the upper surface of the base part is coplanar with an upper surface of the second electronic component;
a third electronic component disposed on and connected to the second electronic component; and
a second underfill resin filled between the second electronic component and the third electronic component, the second underfill resin directly contacting all upper and side surfaces of the alignment mark.

2. The electronic component device according to claim 1, wherein the alignment mark includes a convex portion of the base part of the first underfill resin.

3. The electronic component device according to claim 1, wherein the second electronic component has a rectangular shape, as seen from above, and the alignment mark is arranged at least in a region outside a pair of apexes on a diagonal line of the second electronic component.

4. The electronic component device according to claim 1, wherein the second underfill resin covers an upper surface of the base part of the first underfill resin and a side surface of the third electronic component.

5. The electronic component device according to claim 1, wherein a side surface of the third electronic component is arranged in a region between a side surface of the second electronic component and a side surface of the base part of the first underfill resin.

6. The electronic component device according to claim 1, wherein the third electronic component has an area greater than an area of the second electronic component.

7. The electronic component device according to claim 1, wherein a material of the first underfill resin is different from a material of the second underfill resin.

8. A manufacturing method of an electronic component device, comprising:

forming a first sealing resin material on a first electronic component;

flip-chip connecting an electrode of a second electronic component to the first electronic component via the first sealing resin material so that a first underfill resin is filled between the first electronic component and the second electronic component while forming a base part having an alignment mark on an upper surface thereof around the second electronic component by the first underfill resin, wherein, except for the alignment mark, the upper surface of the base part is coplanar with an upper surface of the second electronic component;

aligning a position of a third electronic component relative to the second electronic component, based on image recognition of the alignment mark; and flip-chip connecting an electrode of the third electronic component to the second electronic component via a second sealing resin material so that a second underfill resin is filled between the second electronic component and the third electronic component and the second underfill resin directly contacts all upper and side surfaces of the alignment mark.

9. A manufacturing method of an electronic component device, comprising:

forming a sealing resin material on a first electronic component;

pushing an electrode of a second electronic component into the sealing resin material to flip-chip connect the electrode to the first electronic component so that a first underfill resin is filled between the first electronic component and the second electronic component while forming a base part having an alignment mark on an upper surface thereof around the second electronic component by the first underfill resin, wherein, except for the alignment mark, the upper surface of the base part is coplanar with an upper surface of the second electronic component;

aligning a position of a third electronic component relative to the second electronic component, based on image recognition of the alignment mark;

flip-chip connecting the third electronic component on the second electronic component in a state that the third electronic component is disposed on the second electronic component; and filling a second underfill resin between the second electronic component and the third electronic component, with the second underfill resin directly contacting all upper and side surfaces of the alignment mark.

10. The manufacturing method of an electronic component device according to claim 8, wherein in the forming the base part having the alignment mark on the upper surface thereof by the first underfill resin, the second electronic component is pushed into the first sealing resin material with being sucked to a bonding tool having an area greater than the second electronic component, a peripheral edge portion of the bonding tool being formed with a concave portion or a convex portion, and a peripheral edge portion of the first sealing resin material is pressed by the peripheral edge portion of the bonding tool, so that the base part and the alignment mark are formed.

11. The manufacturing method of an electronic component device according to claim 9, wherein in the forming the base part having the alignment mark on the upper surface thereof by the first underfill resin, the second electronic component is pushed into the first sealing resin material with being sucked to a bonding tool having an area greater than the second electronic component, a peripheral edge portion of the bonding tool being formed with a concave portion or a convex portion, and a peripheral edge portion of the first sealing resin material is pressed by the peripheral edge portion of the bonding tool, so that the base part and the alignment mark are formed.

12. The manufacturing method of an electronic component device according to claim 8, wherein in the forming the base part having the alignment mark on the upper surface thereof by the first underfill resin, the second electronic component has a rectangular shape, as seen from above, and the alignment mark is arranged at least in a region outside a pair of apexes on a diagonal line of the second electronic component.

13. The manufacturing method of an electronic component device according to claim 9, wherein in the forming the base part having the alignment mark on the upper surface thereof by the first underfill resin, the second electronic component has a rectangular shape, as seen from above, and the alignment mark is arranged at least in a region outside a pair of apexes on a diagonal line of the second electronic component.

14. The manufacturing method of an electronic component device according to claim 8, wherein an area of the third electronic component is greater than an area of the second electronic component, and wherein in the filling the second underfill resin, the second underfill resin covers an upper surface of the base part of the first underfill resin and a side surface of the third electronic component.

15. The manufacturing method of an electronic component device according to claim 9, wherein an area of the third electronic component is greater than an area of the second electronic component, and wherein in the filling the second underfill resin, the second underfill resin covers an upper surface of the base part of the first underfill resin and a side surface of the third electronic component.

16. The electronic component device according to claim 1, wherein the alignment mark includes a concave portion of the base part of the first underfill resin.

17. The electronic component device according to claim 1, wherein the alignment mark, as seen from above, has one of a circular shape, a rectangular shape, an L-shape, and a cross shape.

18. The electronic component device according to claim 1, wherein the first electronic component is electrically connected to the second electronic component via an electrode.

19. The electronic component device according to claim 1, wherein the second electronic component is electrically connected to the third electronic component via an electrode.

20. The electronic component device according to claim 1, further comprising:

a mold resin sealing the first electronic component, the second electronic component, the third electronic component, the first underfill resin, and the second underfill resin.

21. The electronic component device according to claim 1, wherein the first electronic component is a wiring substrate, and the second electronic component and the third electronic component are each a semiconductor chip.

22. The electronic component device according to claim 1, wherein the first electronic component and the second electronic component are each a wiring substrate, and the third electronic component is a semiconductor chip.

23. The electronic component device according to claim 1, wherein the first electronic component, the second electronic component, and the third electronic component are each a semiconductor chip.

24. The electronic component device according to claim 1, wherein the first electronic component, the second electronic component, and the third electronic component are each a wiring substrate.

* * * * *